(12) United States Patent
Terashima

(10) Patent No.: US 7,825,430 B2
(45) Date of Patent: Nov. 2, 2010

(54) SEMICONDUCTOR DEVICE WITH A HIGH BREAKDOWN VOLTAGE DEVICE

(75) Inventor: Tomohide Terashima, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 480 days.

(21) Appl. No.: 11/852,747

(22) Filed: Sep. 10, 2007

(65) Prior Publication Data

US 2008/0251811 A1 Oct. 16, 2008

(30) Foreign Application Priority Data

Apr. 12, 2007 (JP) ............... 2007-104999

(51) Int. Cl.
*H01L 29/74* (2006.01)
*H01L 31/111* (2006.01)
(52) U.S. Cl. ............... 257/140; 257/466; 257/E27.014; 257/E27.06
(58) Field of Classification Search ........... 257/140, 257/133, 206, 509, 506, 492, 341, 513, 514, 257/515, 170, 374, 466, 510, E27.014, E27.06, 257/E29.2
See application file for complete search history.

(56) References Cited

U.S. PATENT DOCUMENTS

| | | | |
|---|---|---|---|
| 5,894,156 A * | 4/1999 | Terashima et al. .......... | 257/374 |
| 6,353,252 B1 | 3/2002 | Yasuhara et al. | |
| 6,468,847 B1 | 10/2002 | Disney | |
| 6,642,599 B1 | 11/2003 | Watabe et al. | |
| 2003/0006458 A1 | 1/2003 | Terashima | |
| 2003/0168712 A1 | 9/2003 | Shin et al. | |
| 2005/0233541 A1 | 10/2005 | Shin et al. | |
| 2007/0045700 A1* | 3/2007 | Ohtani et al. ............... | 257/301 |

FOREIGN PATENT DOCUMENTS

| | | |
|---|---|---|
| JP | 2001-44424 | 2/2001 |
| JP | 2001-145370 | 5/2001 |
| JP | 2003-17695 | 1/2003 |
| JP | 2006-186392 | 7/2006 |
| KR | 10-0456691 | 9/2003 |

* cited by examiner

*Primary Examiner*—Davienne Monbleau
*Assistant Examiner*—Dilinh P Nguyen
(74) *Attorney, Agent, or Firm*—Oblon, Spivak, McClelland, Maier & Neustadt, L.L.P.

(57) ABSTRACT

An $n^-$ type semiconductor region is provided with an $n^-$ diffusion region serving as a drain region, and at one side of the $n^-$ diffusion region a p diffusion region and an $n^+$ diffusion region serving as a source region are provided. At an other side of the $n^-$ diffusion region a trench is provided and has an insulator introduced therein. Immediately under the $n^-$ diffusion region a $p^-$ buried layer is provided. In a region of the $n^-$ semiconductor region an $n^+$ diffusion region to which a high potential is applied is provided and electrically connected to the $n^-$ diffusion region by an interconnect having a resistor. On a surface of a portion of the p diffusion region that is sandwiched between the $n^+$ diffusion region and the $n^-$ diffusion region a gate electrode is provided, with a gate insulation film posed therebetween.

12 Claims, 33 Drawing Sheets

SEMICONDUCTOR DEVICE WITH A HIGH BREAKDOWN VOLTAGE DEVICE

BACKGROUND OF THE INVENTION

1. Field of the Invention

The present invention relates generally to semiconductor devices and particularly to semiconductor devices including a high breakdown voltage device employed in a drive control circuit for operating induction motors and the like.

2. Description of the Background Art

To operate an induction motor or a similar load a drive control circuit (a driver circuit) is provided. The driver circuit includes a first driver circuit responsible for an operation delivering a current to the load (an operation A) and a second driver circuit responsible for an operation drawing a current from the load (an operation B) and operations A and B are alternately performed. To alternately perform operations A and B, the first and second driver circuits have a first IGBT and a second IGBT, respectively, alternately turned on/off. The first and second IGBTs are connected in series and a node connecting them is connected to the load.

In the first driver circuit the first IGBT has its gate turned on/off with reference to the node's potential to provide a switching operation between a high voltage potential and the node's reference potential. In the second driver circuit the second IGBT has its gate turned on/off with reference to a ground potential to provide a switching operation between the node's reference potential and the ground potential.

As the ground potential is fixed, using the ground potential as a reference to generate a pulse potential for turning on/off the gate of the second IGBT is not accompanied by a serious problem. If the node's potential is used as a reference, however, it will vary between the high voltage potential and the ground potential. Thus the node's potential varies in too large a range to generate a pulse potential for turning on/off the gate of the first IGBT.

Accordingly a semiconductor device (or circuit) including a field effect transistor and a predetermined resistor is provided. In this semiconductor device a range for which if the field effect transistor's drain voltage significantly varies its drain current substantially does not vary, i.e., a saturation range, is utilized to generate a fixed potential difference across the resistor to generate a pulse potential for turning on/off the gate of the first IGBT. One such drive control circuit is disclosed for example in Japanese Patent Laying-open No. 2001-145370.

However, conventional semiconductor devices have the following problem: If a semiconductor device is reduced in footprint to miniaturize the drive control circuit, a relationship with a depletion layer's extension occasionally makes it difficult to ensure sufficient breakdown voltage. Furthermore, if the semiconductor device is configured of semiconductor regions including a semiconductor region having some impurity concentration, it cannot ensure sufficient breakdown voltage.

SUMMARY OF THE INVENTION

The present invention has been made to overcome such disadvantages and it contemplates a semiconductor device that can ensure sufficient breakdown voltage.

The present invention provides a semiconductor device including a first semiconductor region of a first conduction type, a second semiconductor region of the first conduction type, a third semiconductor region of a second conduction type, a trench having a predetermined depth, a fourth semiconductor region of the first conduction type, a fifth semiconductor region of the second conduction type, a sixth semiconductor region of the first conduction type, an electrode portion, and an interconnect. The first semiconductor region of the first conduction type has a main surface. The second semiconductor region of the second conduction type serves as a drain region of a field effect transistor. The second semiconductor region extends from one side to an other side and also extends from the main surface of the first semiconductor region to a predetermined depth. The third semiconductor region of the second conduction type is provided at one side of the second semiconductor region and extends from a surface of the first semiconductor region to a predetermined depth to space one side of the second semiconductor region and the first semiconductor region from each other. The trench having the predetermined depth is provided at the other side of the second semiconductor region at a surface of the first semiconductor region to space the other side of the second semiconductor region and the first semiconductor region from each other. The fourth semiconductor region of the first conduction type serves as a source region of the field effect transistor. The fourth semiconductor region is provided in a region extending from a surface of the third semiconductor region to a depth shallower than a bottom of the third semiconductor region such that the fourth semiconductor region is spaced from the first semiconductor region by the third semiconductor region. The fifth semiconductor region of the second conduction type is provided in contact with a bottom of the third semiconductor region and a bottom of the trench and extends from the bottom of the third semiconductor region to the bottom of the trench to space a bottom of the second semiconductor region and the first semiconductor region from each other. The sixth semiconductor region of the first conduction type is spaced from the trench. The sixth semiconductor region is located in a region opposite to the third semiconductor region with the trench posed therebetween. The sixth semiconductor region extends from a surface of the first semiconductor region to a predetermined depth. A predetermined high potential is connected to the sixth semiconductor region. The electrode portion serves as a gate electrode of the field effect transistor. The electrode portion is provided on a surface of a portion of the third semiconductor region that is sandwiched between the second semiconductor region and the fourth semiconductor region, with a gate insulation film posed therebetween. The interconnect has a predetermined resistance and electrically connects the second semiconductor region and the sixth semiconductor region together.

The present invention provides another semiconductor device including a first semiconductor region of a first conduction type, a second semiconductor region of the first conduction type, a third semiconductor region of a second conduction type, a fourth semiconductor region of the first conduction type, a fifth semiconductor region of the second conduction type, a sixth semiconductor region of the first conduction type, an electrode portion, and an interconnect. The first semiconductor region of the first conduction type has a main surface. The second semiconductor region of the second conduction type serves as a drain region of a field effect transistor. The second semiconductor region extends from one side to an other side and also extends from the main surface of the first semiconductor region to a first depth. The third semiconductor region of the second conduction type is provided at a surface of the first semiconductor region and extends to a predetermined depth, and sandwiches the second semiconductor region at one side of the second semiconductor region and the other side of the second semiconductor region to space one side of the second semiconductor region and the first semiconductor region from each other and also space the other side of the second semiconductor region and the first semiconductor region from each other. The fourth semiconductor region of the first conduction type serves as a source region of the field effect transistor. The fourth semiconductor region is provided in a region extending from a surface of the third semiconductor region to a depth shallower than a bottom of the third semiconductor region such that the fourth semiconductor region is spaced from the first semiconductor region by the third semiconductor region. The fifth semiconductor region of the second conduction type is provided in contact with a bottom of the third semiconductor region located at one side of the second semiconductor region and a bottom of the third semiconductor region located at the other side of the second semiconductor region. The fifth semiconductor region extends from the bottom of the third semiconductor region located at one side to the bottom of the third semiconductor region located at the other side. The fifth semiconductor region has a predetermined impurity concentration allowing the fifth semiconductor region, with the field effect transistor in an off state, to be completely depleted by a depletion layer extending from an interface with the second semiconductor region and a depletion layer extending from an interface with the first semiconductor region. The sixth semiconductor region of the first conduction type is spaced from the third semiconductor region located at the other side. The sixth semiconductor region is located in a region opposite to the third semiconductor region located at one side, with the third semiconductor region located at the other side posed therebetween. The sixth semiconductor region extends from a surface of the first semiconductor region to a predetermined depth. A predetermined high potential is connected to the sixth semiconductor region. The electrode portion serves as a gate electrode of the field effect transistor. The electrode portion is provided on a surface of a portion of the third semiconductor region that is sandwiched between the second semiconductor region and the fourth semiconductor region, with a gate insulation film posed therebetween. The interconnect has a predetermined resistance and electrically connects the second semiconductor region and the sixth semiconductor region together.

The present semiconductor device can include a trench that is provided in a surface of the first semiconductor region at the other side of the second semiconductor region that is opposite to one side thereof adjacent to the third semiconductor region such that the trench spaces the other side of the second semiconductor region and the first semiconductor region from each other. Thus at the other side of the second semiconductor region there does not exist a pn junction and the trench can be provided adjacent to one side of the second semiconductor region to achieve a reduced footprint. A semiconductor device ensuring sufficient breakdown voltage and also miniaturized can thus be obtained.

Another present semiconductor device allows the fifth semiconductor region of the second conduction type, with the field effect transistor in the off state, to be completely depleted. In comparison with a case with the fifth semiconductor region incompletely depleted and a pn junction present depthwise, the present semiconductor device can ensure sufficient depthwise breakdown voltage and thus be improved in breakdown voltage as a whole.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
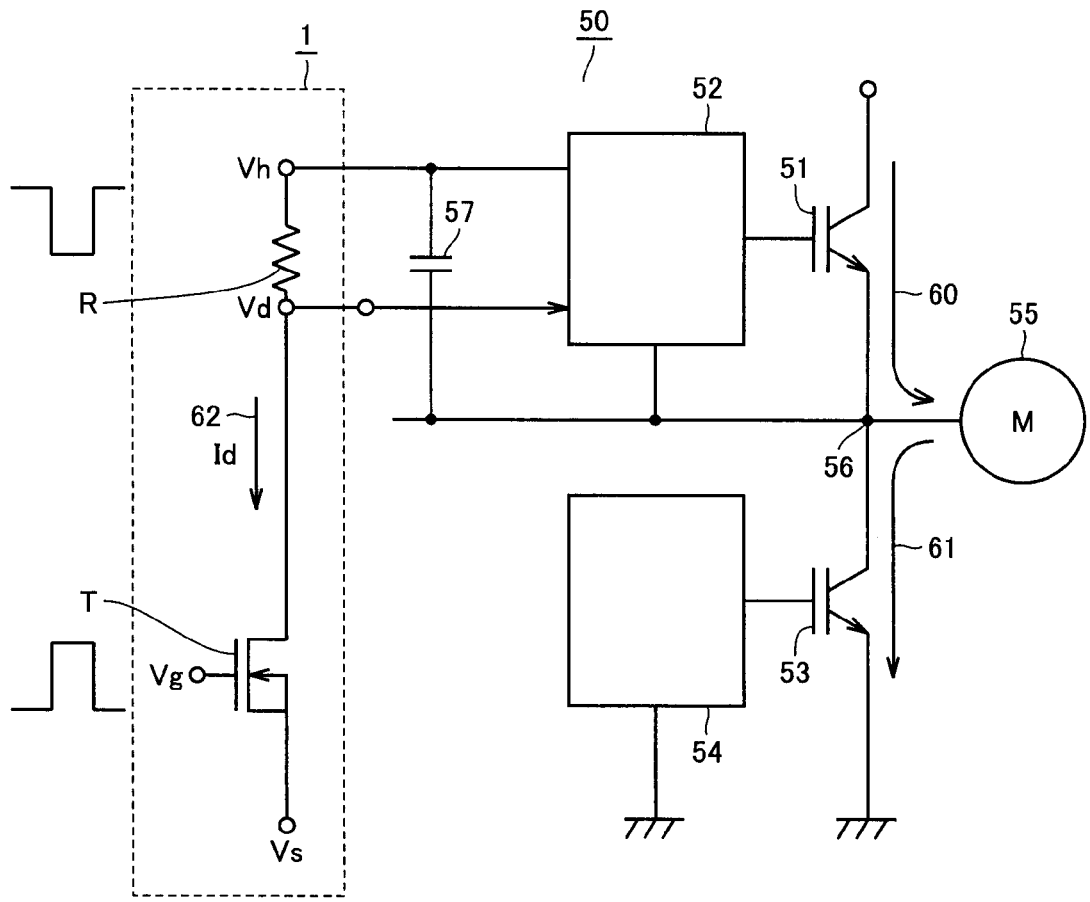
FIG. 1 shows the present semiconductor device of a first embodiment and a drive control circuit with the semiconductor device applied thereto.

Initially one example of a drive control circuit to which the present semiconductor device is applied will briefly be described. As shown in FIG. 1, a drive control circuit 50 includes a first driver circuit 52 and a second driver circuit 54 provided with a first IGBT 51 serving as a switching element for performing an operation delivering a current, as indicated by an arrow 60, into an induction motor or similar load 55 (an operation A) and a second IGBT 53 serving as a switching element for performing an operation drawing a current, as indicated by an arrow 61, from load 55 (an operation B), respectively.

First and second IGBTs 51 and 53 are connected in series and their node 56 is connected to load 55. First IGBT 51 has a gate connected to first driver circuit 52 and second IGBT 53 has a gate connected to second driver circuit 54. First and second driver circuits 52 and 54 turn first and second IGBTs 51 and 53 on/off alternately to perform operations A and B alternately.

In particular, to allow first driver circuit 52 connected to node 56, which varies in potential between a power supply potential and a ground potential, to generate a predetermined pulse potential for turning on/off the gate of first IGBT 51, the present semiconductor device 1 is connected in the form of a circuit including a field effect transistor T and a resistor R, as surrounded by a dotted line. Field effect transistor T has a drain electrode connected to a predetermined one end of resistor R, and a source electrode set at a ground potential or a predetermined potential. Furthermore the drain electrode is also connected to first driver circuit 52. Resistor R has the other end connected to one end of a capacitor 57 serving as a power supply for first driver circuit 52. Capacitor 57 has the other end connected to node (or load) 56.

The drain electrode will thus have a potential varying alternately between a high voltage Vh corresponding to a voltage (e.g., of approximately 300 V) driving the induction motor and a low voltage V1 corresponding to the ground potential. When in this condition field effect transistor T has its gate turned on a current (a drain current Id) flows from the drain to the source.

Figure 2:
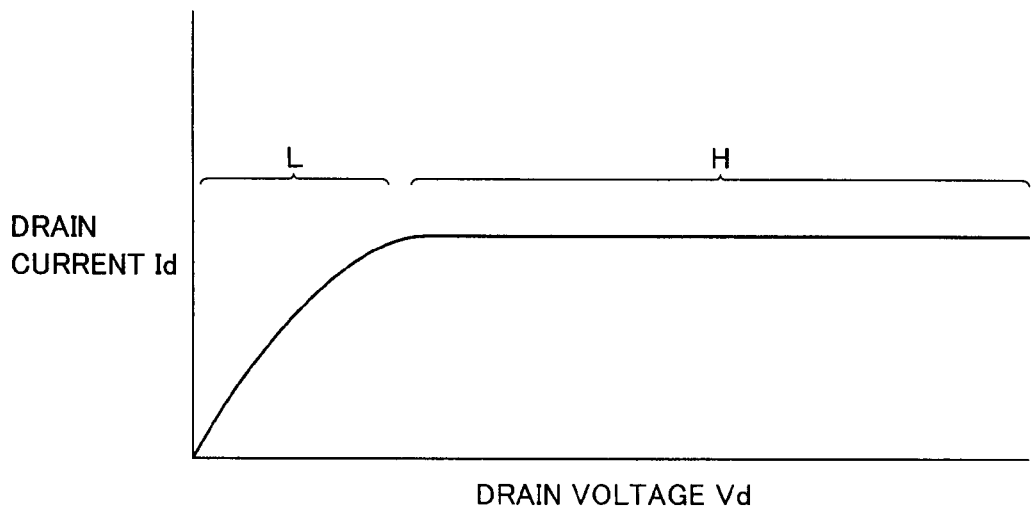
FIG. 2 is a graph representing a relationship between a drain current and a drain voltage in a field effect transistor in the same embodiment.

A field effect transistor's drain voltage and drain current generally has a relationship, as shown in FIG. 2 in the form of a graph. As shown in FIG. 2, the drain voltage and the drain current has a relationship having a linear range L and a saturation range H. In linear range L the drain current increases substantially in proportion to the drain voltage as it increases. In saturation range H, in contrast, the drain current does not increase but has a substantially constant value while the drain voltage increases. Note that the drain current has a value determined by the gate voltage.

In the present semiconductor device 1 the drain voltage is set to fall within saturation range H so that if drain voltage Vd significantly varies, drain current Id is substantially constant, and a voltage drop caused as a current passes through resistor R, i.e., a current value multiplied by a resistance value, has a substantially fixed value. Thus when field effect transistor turns on, a voltage drop of the fixed value is responsively caused across resistor R, and this voltage drop will be applied as a pulse potential to turn on/off the gate of first IGBT 51. In other words, a logic signal provided with reference to the source's potential (Vs) will be converted to a logic signal provided with reference to high potential Vh.

Figure 3:
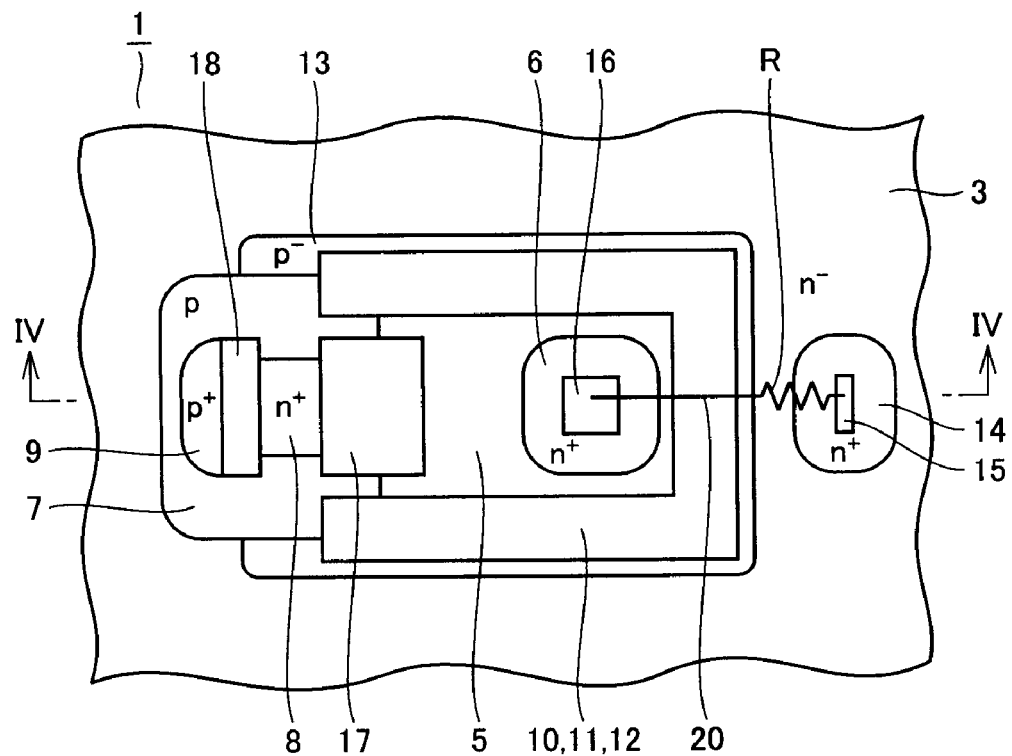
FIG. 3 is a plan view of the semiconductor device of the same embodiment.
Figure 4:
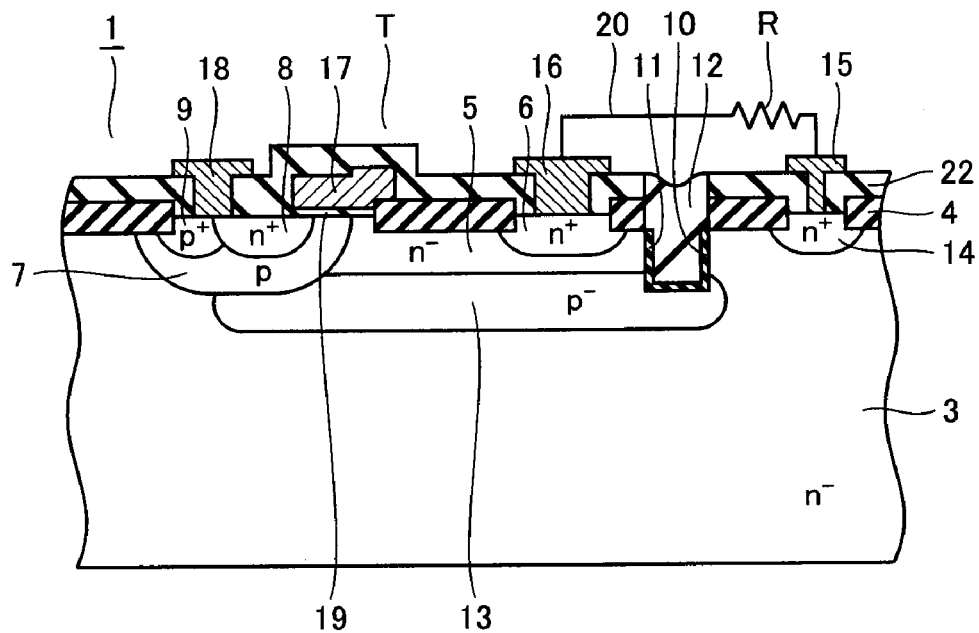
FIG. 4 is a cross section in the same embodiment, as taken along a line IV-IV shown in FIG. 3.

Semiconductor device 1 has a structure in one example, as will be described hereinafter. As shown in FIGS. 3 and 4, an n⁻ type semiconductor region 3 has a main surface provided with a local oxidation of silicon (LOCOS) film 4. An n⁻ type diffusion region (an n⁻ diffusion region) 5 serving as a drain region of field effect transistor T is provided in n⁻ type semiconductor region 3 from a surface of a predetermined region to a predetermined depth. N⁻ diffusion region 5 extends from one side to an other side. An n⁺ type diffusion region (an n⁺ diffusion region) 6 is provided at a surface of n⁻ diffusion region 5 and in a vicinity of the surface. A drain electrode 16 is provided on a surface of n⁺ diffusion region 6.

N⁻ diffusion region 5 has one side in contact with a p type diffusion region (a p diffusion region) 7. P diffusion region 7 extends from a surface of n⁻ type semiconductor region 3 to a predetermined depth to space a side portion of n⁻ diffusion region 5 and n⁻ type semiconductor region 3 from each other. In p diffusion region 7 an n⁺ type diffusion region (an n⁺ diffusion region) 8 is provided to serve as the source region of field effect transistor T. N⁺ diffusion region 8 is provided in a region extending from a surface of p diffusion region 7 to a depth shallower than the bottom of p diffusion region 7 so that n⁺ diffusion region 8 is spaced from n⁻ type semiconductor region 3 by p diffusion region 7. Furthermore in p diffusion region 7 a p⁺ type diffusion region (a p⁺ diffusion region) 9 is provided. A source electrode 18 is provided in contact with n⁺ diffusion region 8 and p⁺ diffusion region 9.

N⁻ diffusion region 5 has an other side adjacent to a trench 10. Trench 10 extends from a surface of n⁻ type semiconductor region 3 to a predetermined depth to space a side portion of n⁻ diffusion region 5 and n⁻ type semiconductor region 3 from each other. Furthermore, in particular, as shown in FIG. 3, trench 10 extends from the other side of n⁻ diffusion region 5 toward a region having p diffusion region 7 and thus surrounds n⁻ diffusion region 5, as seen in a plane (see FIG. 3). Trench 10 has a side surface provided with a thermal oxide film 11 and an insulator 12 is introduced in trench 10.

Immediately under the drain region, or n⁻ diffusion region 5, a p⁻ type buried layer (a p⁻ buried layer) 13 is provided in contact with a bottom of n⁻ diffusion region 5. P⁻ buried layer 13 extends from a region immediately underlying a bottom of p diffusion region 7 to a region immediately underlying a bottom of trench 10 to space a bottom of n⁻ diffusion region 5 and n⁻ type semiconductor region 3 from each other. Furthermore p⁻ buried layer 13 has an impurity concentration set to be relatively low so that it is completely depleted when the field effect transistor is in the off state.

Furthermore, an n+ type diffusion region (an n+ diffusion region) 14 to which a predetermined high potential is applied is provided in a region of n− type semiconductor region 3 that is opposite to p diffusion region 7 with trench 10 posed therebetween. An electrode 15 is provided on a surface of n+ diffusion region 14. Electrode 15 and drain electrode 16 are electrically connected together by an interconnect 20 provided with resistor R. A gate electrode 17 is provided on a surface of a portion of p diffusion region 7 that is sandwiched between n+ diffusion region 8 and n− diffusion region 5, with a gate insulation film 19 posed therebetween. Gate electrode 17 is covered by an insulation film 22. The present semiconductor device 1 is thus configured.

Note that the first semiconductor region of the first conduction type in the semiconductor device described in the Summary of the Invention section corresponds to n− type semiconductor region 3 and the second semiconductor region of the second conduction type corresponds to n− diffusion region 5. Furthermore the third semiconductor region of the second conduction type corresponds to p diffusion region 7 and the fourth semiconductor region of the first conduction type corresponds to n+ diffusion region 8. The fifth semiconductor region of the second conduction type corresponds to p− buried layer 13 and the sixth semiconductor region of the first conduction type corresponds to n+ diffusion region 14.

Figure 5:
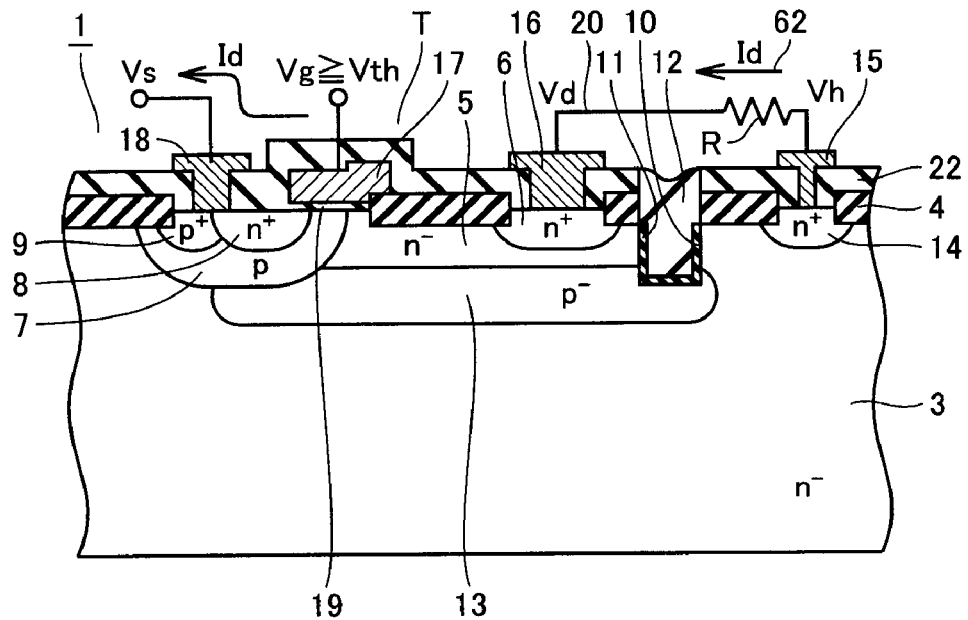
FIGS. 5 and 6 are cross sections in the same embodiment in on and off states, respectively, for illustrating the semiconductor device's operation.

The above described semiconductor device 1 operates as will be described hereinafter. Initially, in the on state, as shown in FIG. 5, field effect transistor T receives a predetermined voltage of at least a threshold voltage, i.e., Vg≧Vth, at gate electrode 17. When the predetermined voltage is applied to gate electrode 17, a channel region (not shown) is formed in p diffusion region 7 immediately underlying gate electrode 17 and a fixed current Id flows from n+ diffusion region 14 through interconnect 20 and thus from the drain region (n− diffusion region 5) to the source region (n+ diffusion region 8). As the fixed current Id flows, a fixed voltage drop is caused across resistor R with reference to potential Vh. Thus a logic signal provided with reference to potential Vs is transmitted as a logic signal provided with reference to potential Vh. The transmitted logic signal will be transmitted to first driver circuit 52 as a signal applied to turn on/off first IGBT 51.

Figure 6:
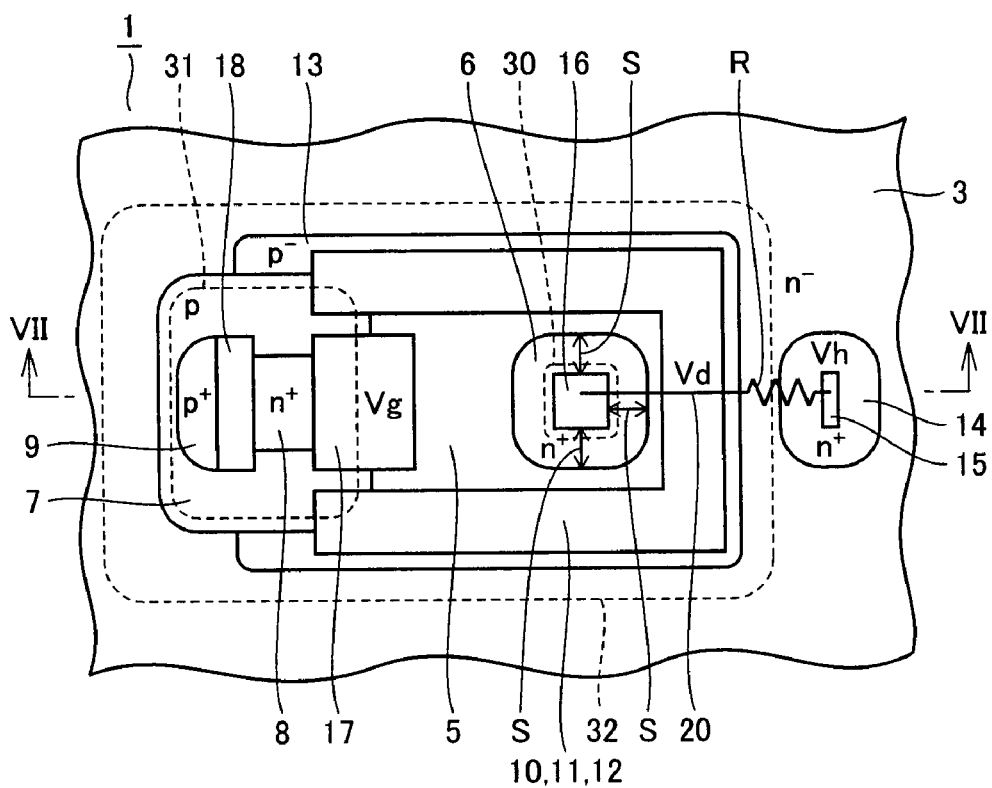
Figure 7:
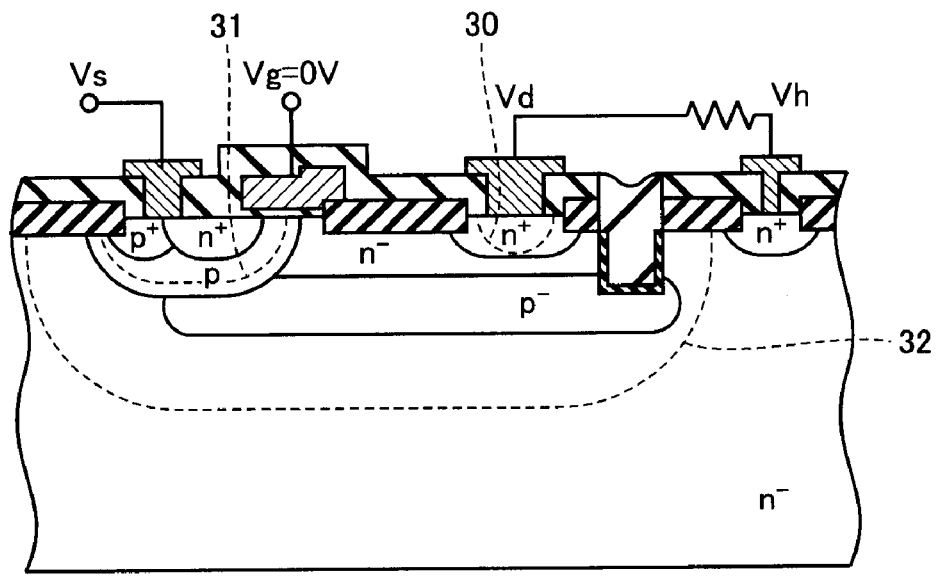
FIG. 7 is a cross section in the same embodiment, as taken along a line VII-VII shown in FIG. 6, for illustrating the semiconductor device's operation.
Figure 8:
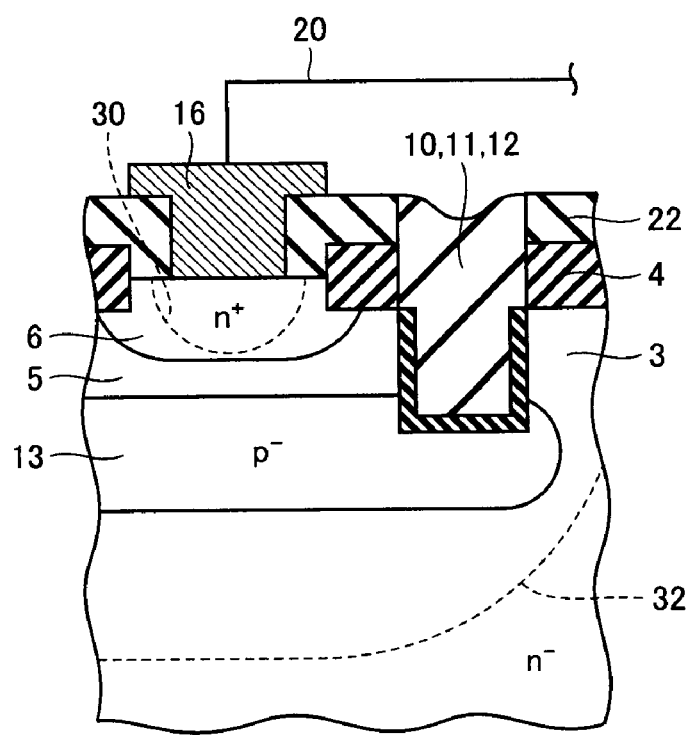
FIG. 8 is an enlarged cross section of a potion of the semiconductor device of the same embodiment in the off state shown in FIG. 7.

In the off state, as shown in FIGS. 6-8, field effect transistor T does not receive voltage at gate electrode 17, i.e., Vg=0V. When at the time high potential Vh (a positive bias) is applied to electrode 15, potential Vd of drain electrode 16 also attains the same high potential and the off state is held. Thus a positive bias is applied via n+ diffusion regions 6 and 14 to n− type semiconductor region 3 and the drain region or n− diffusion region 5 to allow a depletion layer (a depletion layer end A) to extend from an interface of a top portion of p− buried layer 13 and n− diffusion region 5 (an interface A) toward p− buried layer 13 and a depletion layer (a depletion layer end B) to extend from an interface of a bottom portion of p− buried layer 13 and n− type semiconductor region 3 (an interface B) toward p− buried layer 13. In this semiconductor device p− buried layer 13 has an impurity concentration set to be relatively low as predetermined. This allows depletion layer ends A and B to join to completely deplete p− buried layer 13.

Furthermore a depletion layer extending from interface A toward n− diffusion region 5, as well as that extending from an interface of p diffusion region 7 and n− diffusion region 5 (an interface C) toward n− diffusion region 5, extend into n+ diffusion region 6, providing a depletion layer end 30. Furthermore, a depletion layer extending from interface C toward p diffusion region 7 joins with that extending from an interface of p diffusion region 7 and n− type semiconductor region 3 (an interface D) toward p diffusion region 7 and thus extends into p diffusion region 7, providing a depletion layer end 31. A depletion layer extending from interface B toward n− type semiconductor region 3 joins with that extending from interface D toward n− type semiconductor region 3 and thus extends from a surface of n− type semiconductor region 3 to a predetermined depth, providing a depletion layer end 32.

Semiconductor device 1 as described above has trench 10 that is posed between the drain region or n− diffusion region 5 and n− type semiconductor region 3 and has insulator 12 introduced therein, and extends toward a region having p diffusion region 7 and thus surrounds a side portion of n− diffusion region 5. When this is compared with a semiconductor device of a comparative example which has a p diffusion region surrounding a side portion of n− diffusion region 5 and has a buried layer having an impurity concentration that does not allow complete depletion in the off state, the former provides the following effect.

Figure 9:
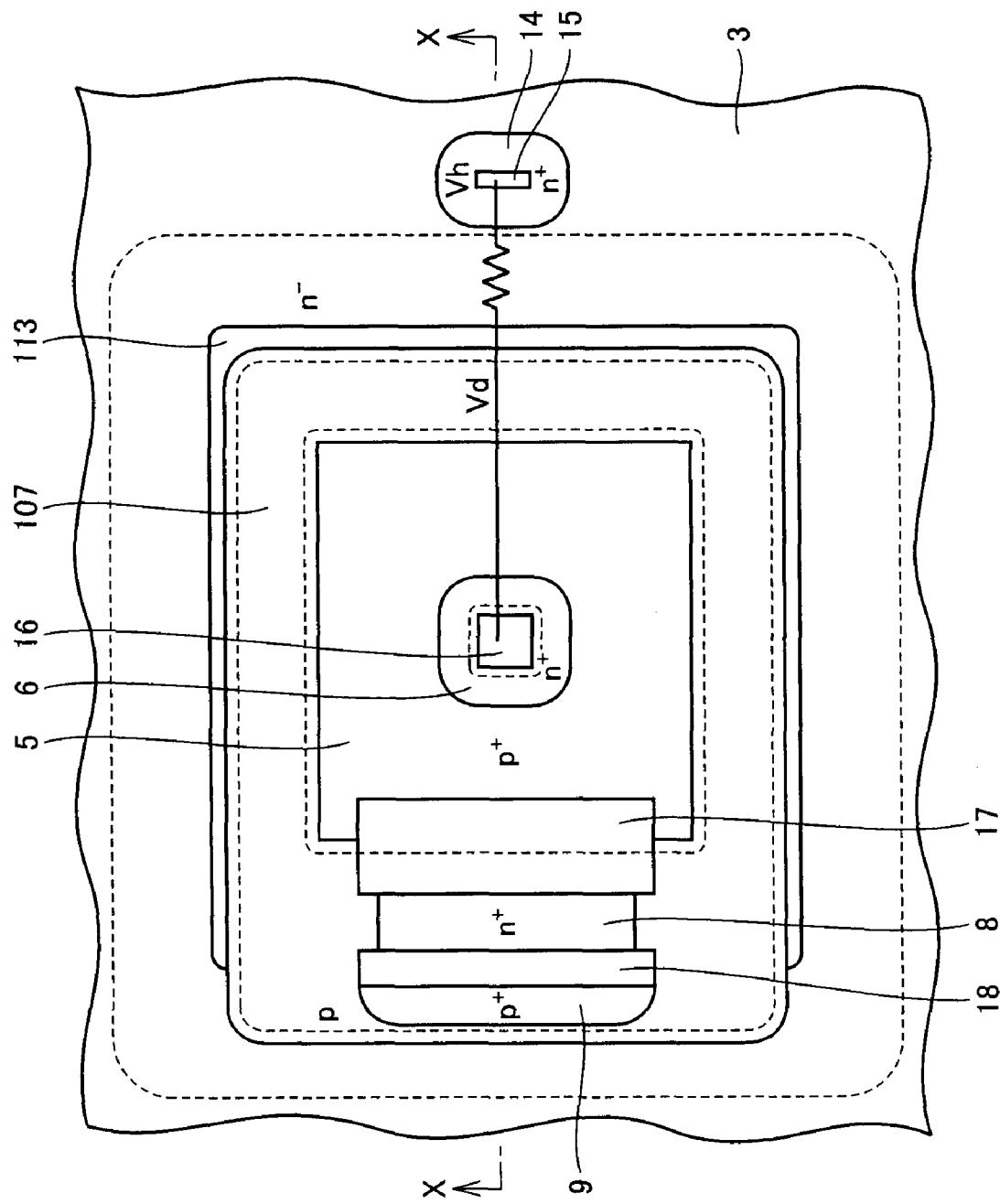
FIG. 9 is a plan view of a semiconductor device of a comparative example in the off state.
Figure 10:
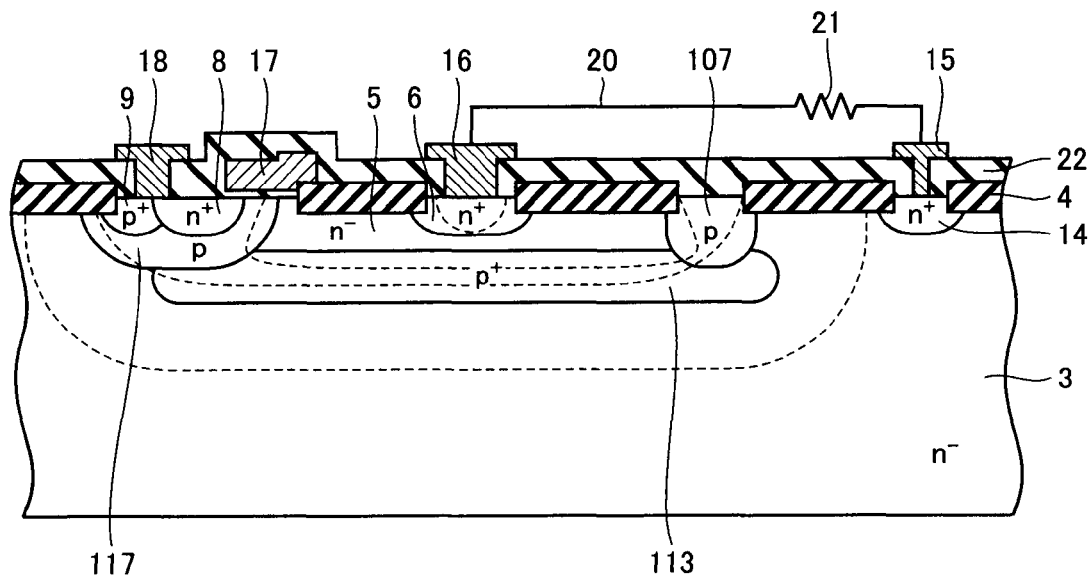
FIG. 10 is a cross section taken along a line X-X shown in FIG. 9.

As shown in FIGS. 9 and 10, the semiconductor device of the comparative example will have a p diffusion region 107 immediately underlying interconnect 20 connecting n− type semiconductor region 3 and the drain region or n− diffusion region 5. Furthermore a p+ buried layer 113 has an impurity concentration set to be relatively high to prevent the layer from complete depletion in the off state. Note that the components of the semiconductor device of the comparative example that are identical to those of the semiconductor device of FIG. 4 and the like are identically denoted.

High potential (Vh) is applied to n− type semiconductor region 3 and ground potential (Vs) is applied to p diffusion region 107. Thus, interconnect 20 of the high potential will traverse p diffusion region 107 of the ground potential and a depletion layer that extends in the off state from an interface of p diffusion region 107 and n− diffusion region 5 will be prevented from extending at a portion immediately underlying interconnect 20. As a result the semiconductor device may disadvantageously have a reduced breakdown voltage in the off state.

In the present semiconductor device 1, in contrast, trench 10 having insulator 12 introduced therein surrounds a side portion of n− diffusion region 5 except for a region having p diffusion region 7, as shown in FIGS. 6-8, and interconnect 20 of high potential will traverse trench 10 having insulator 12 introduced therein. Consequently in a region immediately underlying interconnect 20 there does not exist a pn junction forming a depletion layer and semiconductor device 1 can be prevented from having a reduced breakdown voltage.

Furthermore, as shown in FIG. 10, in the semiconductor device of the comparative example, a side portion of the drain region or n− diffusion region 5 (depthwise) and n− type semiconductor region 3 have breakdown voltage ensured by a depletion layer extending from an interface of n− diffusion region 5 and p diffusion region 107 (i.e., a pn junction). P diffusion region 107 has the ground potential and n+ diffusion region 6 provided in n− diffusion region 5 receives high potential (Vh) via interconnect 20. Accordingly, to obtain breakdown voltage of n+ diffusion region 6 and p diffusion region 107, as desired, a region in which a depletion layer extends must be ensured, and p diffusion region 107 must be spaced from n+ diffusion region by a distance of some extent. This has been an obstacle in miniaturizing the semiconductor device.

In the present semiconductor device 1, in contrast, trench 10 having insulator 12 introduced therein surrounds a side portion of n− diffusion region 5 except for a region having p diffusion region 7, as shown in FIGS. 6 and 7. Thus at the side portion of n⁻ diffusion region 5 there does not exist a pn junction and a distance S between n⁺ diffusion region 6 and trench 10 can be reduced. This ensures that semiconductor device 1 has sufficient breakdown voltage and is also miniaturized.

Figure 11:
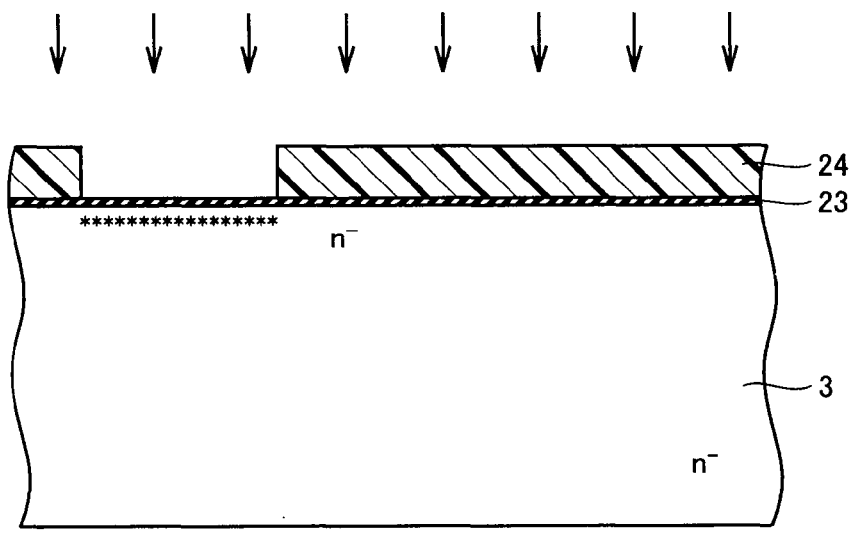
FIG. 11 is a cross section for illustrating one step of a method of fabricating the semiconductor device shown in FIGS. 3 and 4 in the same embodiment.

The above described semiconductor device is fabricated in a method, by way of example, as will be described hereinafter. As shown in FIG. 11, initially on a surface of n⁻ type semiconductor region 3 a silicon nitride film 23 is provided for providing a LOCOS film. On a surface of silicon nitride film 23 a resist pattern 24 is provided. With resist pattern 24 used as a mask, boron (B) is injected in a dose for example of approximately $1 \times 10^{13}$ to $5 \times 10^{13}$ cm$^{-2}$. Subsequently resist pattern 24 is removed.

Figure 12:
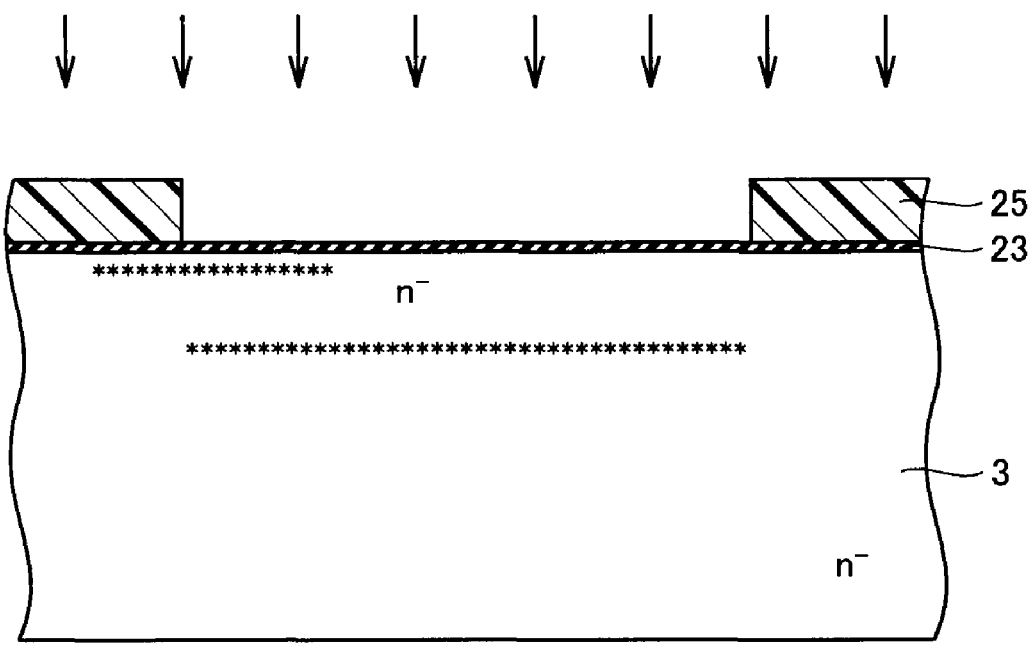
FIGS. 12-20 are cross sections for illustrating steps performed after those shown in FIGS. 11-19, respectively, in the same embodiment.

Then, as shown in FIG. 12, on a surface of silicon nitride film 23 a resist pattern 25 is provided. With resist pattern 25 used as a mask, boron (B) is injected in a dose for example of approximately $1 \times 10^{12}$ to $3 \times 10^{12}$ cm$^{-2}$ by high energy injection from a surface of n⁻ type semiconductor region 3 into a region to a depth of approximately 2 μm to 5 μm. Subsequently resist pattern 25 is removed.

Figure 13:
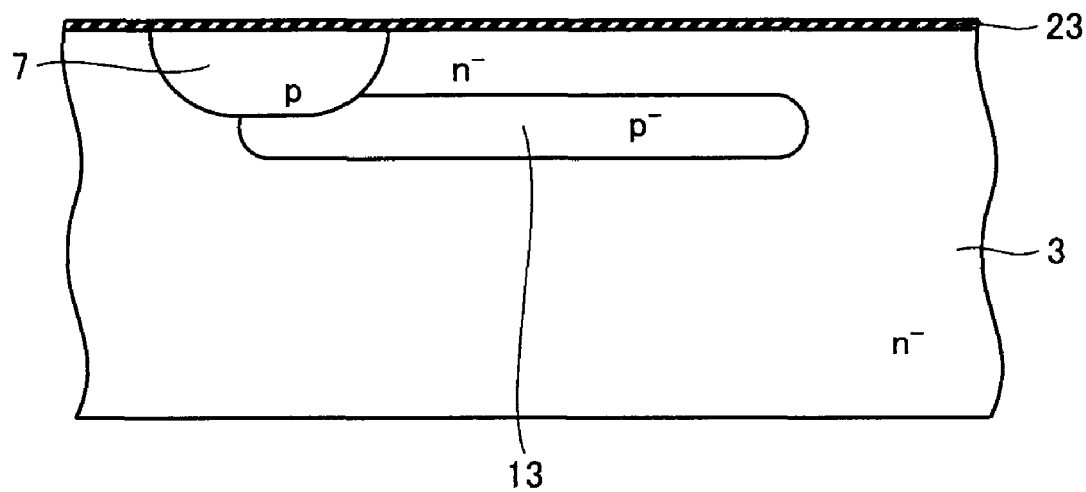
Figure 14:
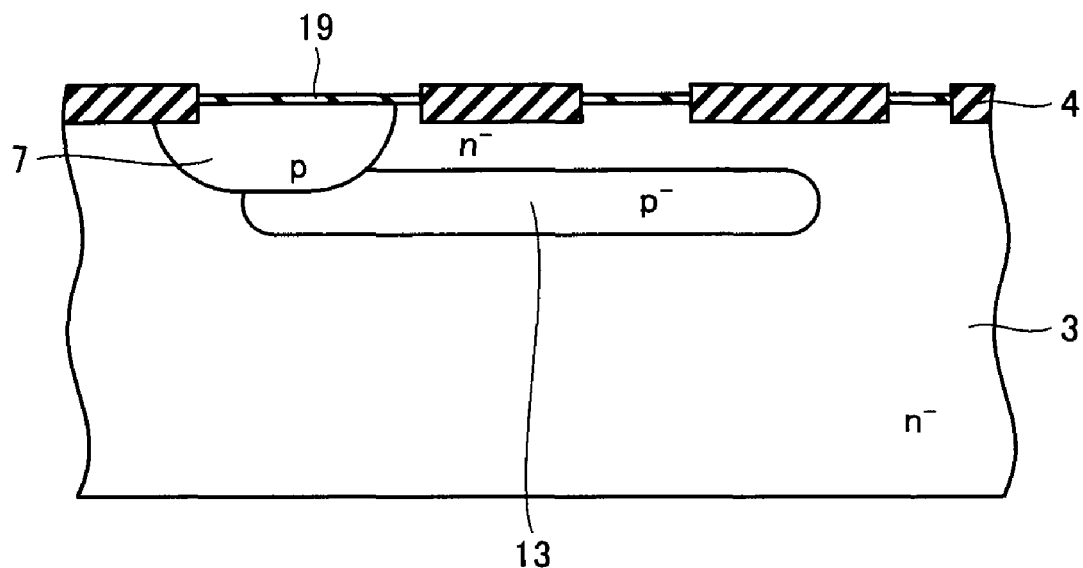

Then, as shown in FIG. 13, the intermediate product is annealed at a predetermined temperature to diffuse the injected boron to provide p diffusion region 7 and p⁻ buried layer 13. Then silicon nitride film 23 has a predetermined region removed to expose a surface of n⁻ type semiconductor region 3. Then the intermediate product is oxidized, as predetermined, to provide LOCOS film 4 at the exposed surface of n⁻ type semiconductor region 3 (see FIG. 14). Thereafter silicon nitride film 23 that remains is removed to expose a surface of n⁻ type semiconductor region 3. Then the intermediate product is thermally oxidized, as predetermined, to provide gate oxide film 19 at the exposed surface of n⁻ type semiconductor region 3, as shown in FIG. 14.

Figure 15:
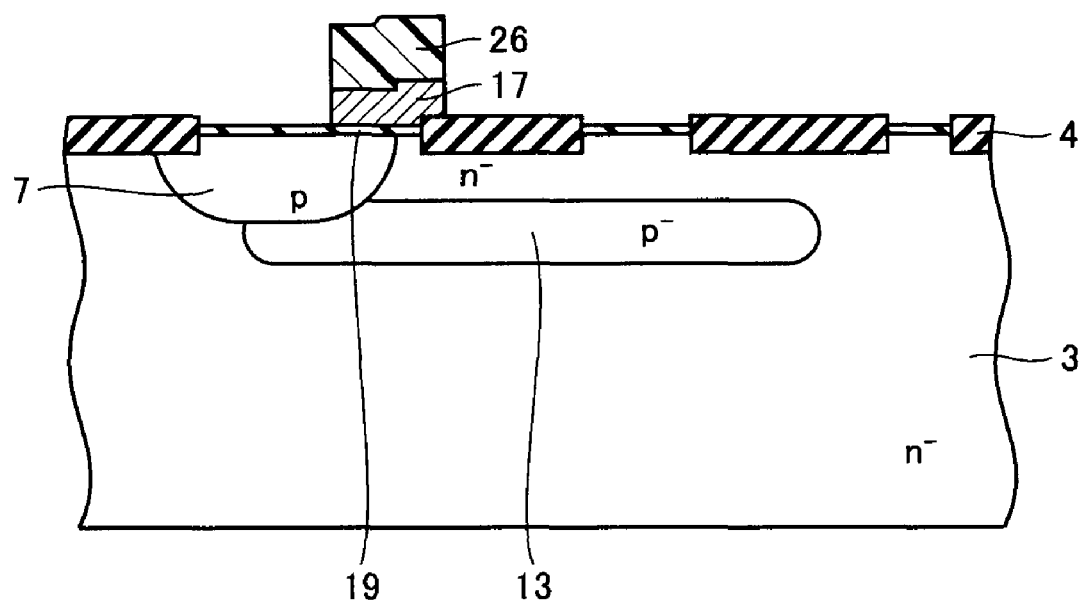
Figure 16:
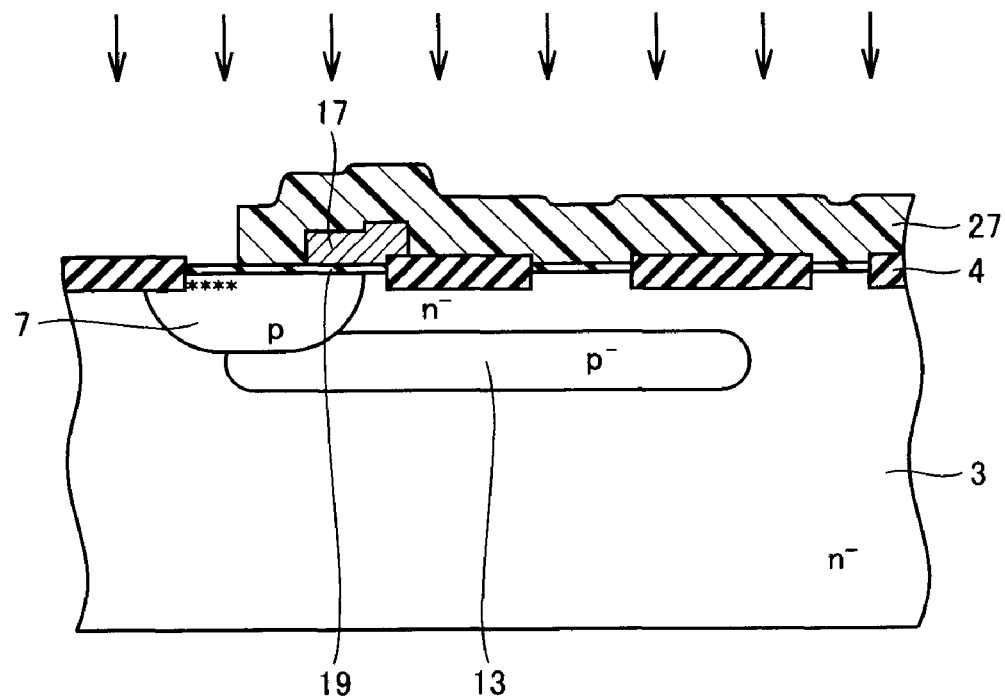

Then on a surface of n⁻ type semiconductor region 3 a polysilicon film (not shown) is provided. On a surface of the polysilicon film a resist pattern 26 is provided. With resist pattern 26 used as a mask, the polysilicon film is anisotropically etched to provide gate electrode 17, as shown in FIG. 15. Thereafter resist pattern 26 is removed. Then as shown in FIG. 16 a resist pattern 27 is provided. With resist pattern 27 used as a mask, boron (B) is injected in a dose for example of approximately $3 \times 10^{15}$ to $6 \times 10^{15}$ cm$^{-2}$ into p diffusion region 7. Subsequently resist pattern 27 is removed.

Figure 17:
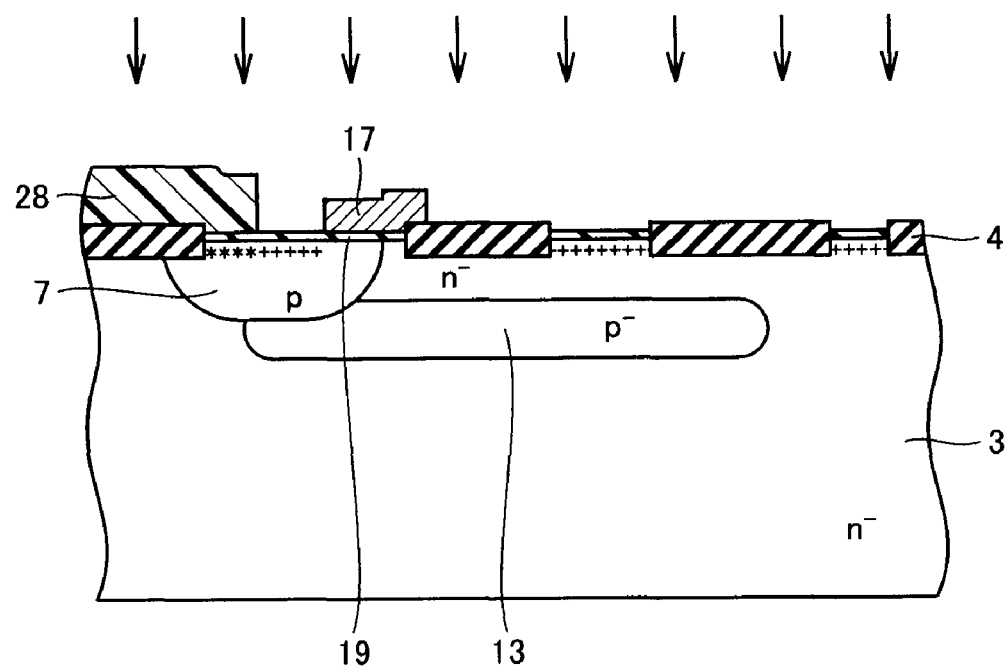

Then as shown in FIG. 17 a resist pattern 28 is provided. With resist pattern 28 used as a mask, phosphorus (P) is injected in a dose for example of approximately $3 \times 10^{15}$ to $6 \times 10^{15}$ cm$^{-2}$ into n⁻ type semiconductor region 3. Subsequently resist pattern 28 is removed. Then gate electrode 17 is covered with insulation film 22. Thereafter the intermediate product is annealed, as predetermined, to diffuse the injected boron and phosphorus to provide p⁺ diffusion region 9 and n⁺ diffusion regions 8, 6 and 14 (see FIG. 18).

Figure 18:
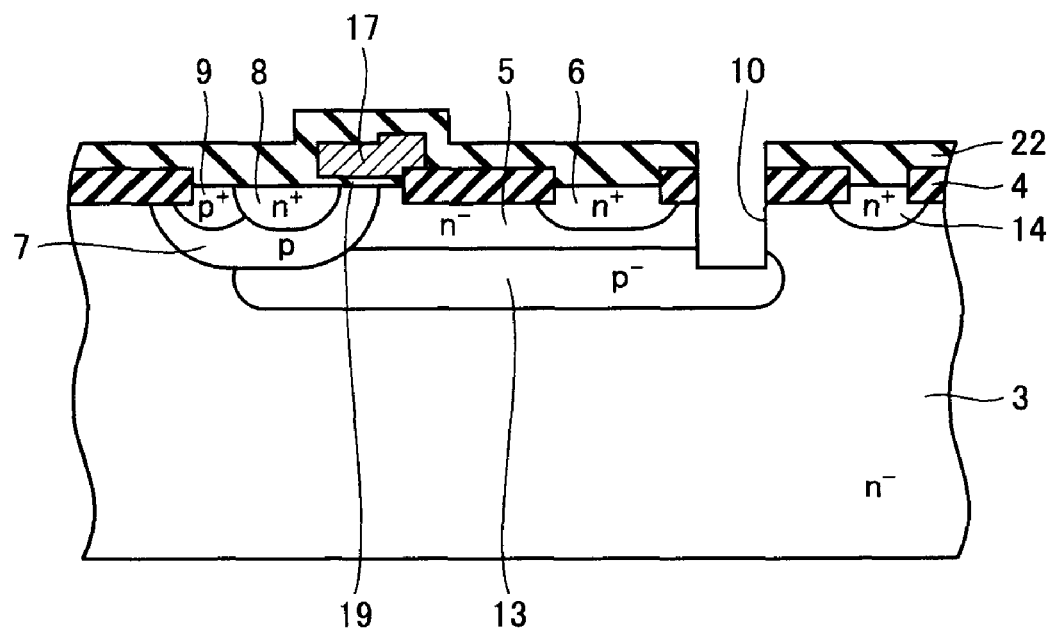

Then a portion of insulation film 22 that is located in a region provided with a trench is removed to provide an insulation film mask for forming the trench. Then, as shown in FIG. 18, with the insulation film mask used as a mask, LOCOS film 4 and n⁻ type semiconductor region 3 are anisotropically etched to provide trench 10 reaching p⁻ buried layer 13.

Figure 19:
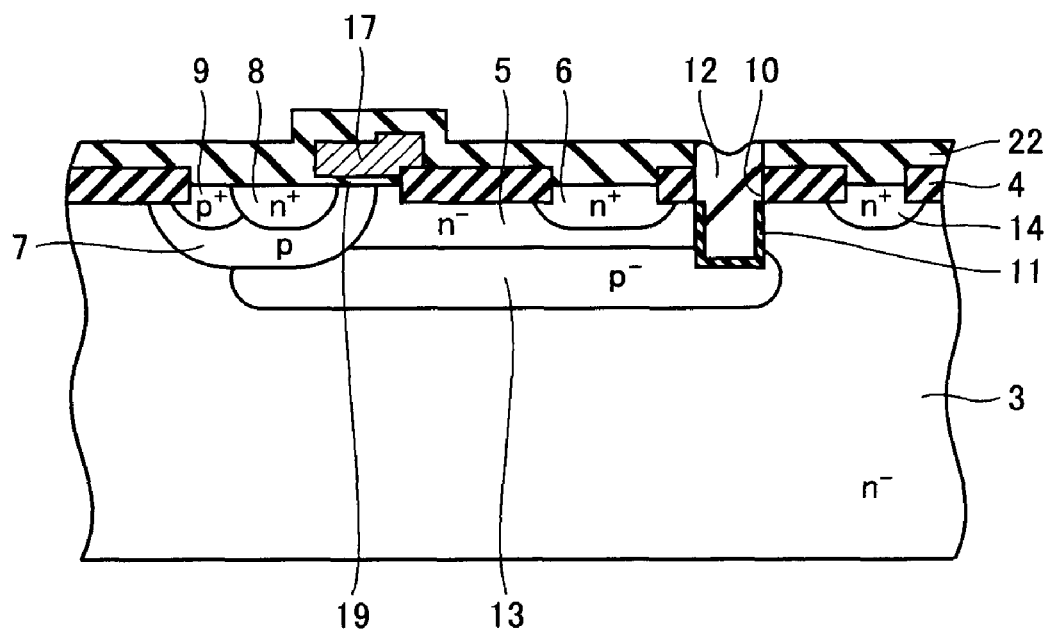

Then as shown in FIG. 19 the intermediate product is oxidized, as predetermined, to provide thermal oxide film 11 at a surface of the n⁻ semiconductor region that is exposed at a sidewall of trench 10. Then a tetra ethyl ortho silicate (TEOS) film (not shown) is provided on insulation film 22 and thus introduced into trench 10. The TEOS film is anisotropically etched away from a top surface of insulation film 22 while the TEOS film remains in trench 10. Trench 10 is thus provided therein with insulator 12 of the TEOS film.

Figure 20:
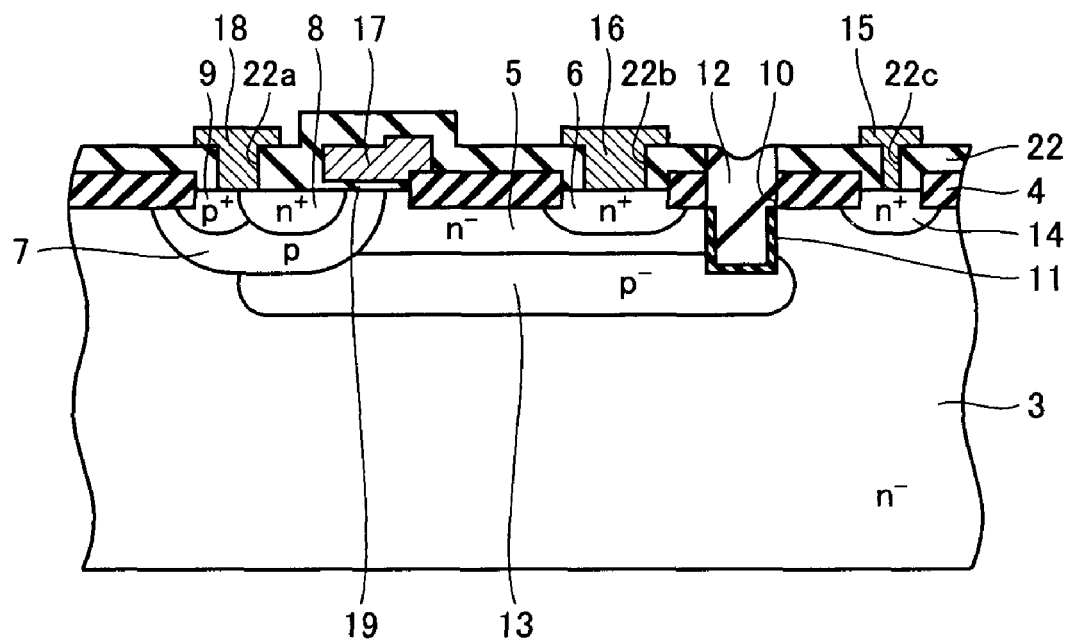

Then as shown in FIG. 20 insulation film 22 is subjected to photolithography and processed, as predetermined, to form openings 22a, 22b, 22c for providing an electrode. Then sputtering is performed to deposit an aluminum-silicon (Al—Si) film (not shown) on insulation film 22 to introduce it into openings 22a, 22b, 22c. The aluminum-silicon film is subjected to photolithography and processed, as predetermined, to provide drain electrode 16, source electrode 18 and electrode 15. The semiconductor device shown in FIGS. 3 and 4 is thus completed.

Figure 21:
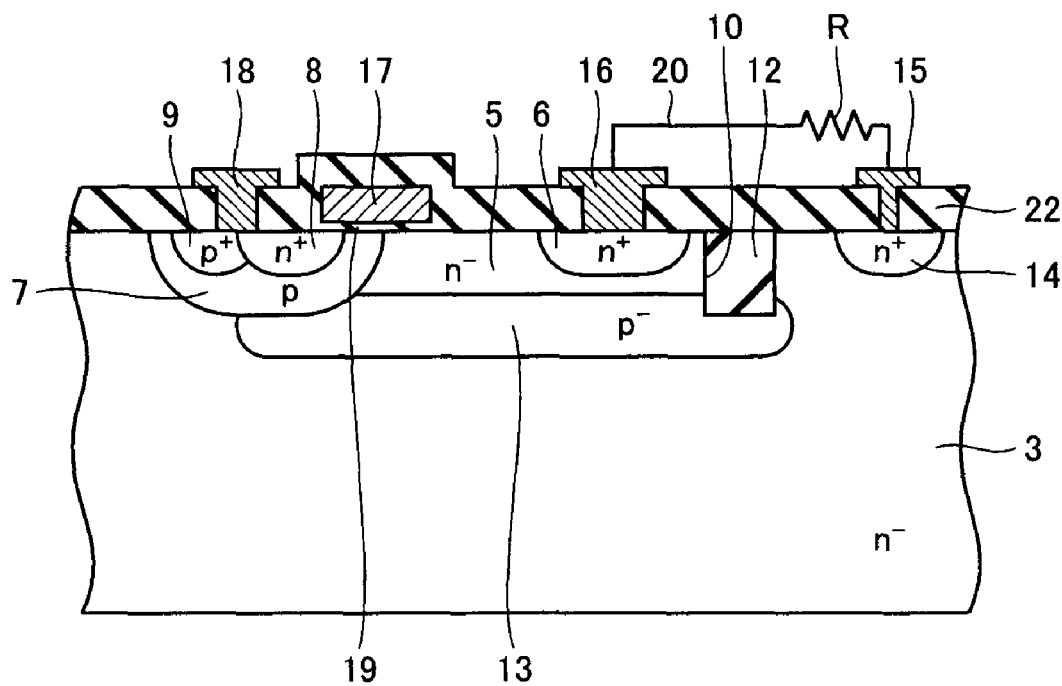
FIG. 21 is a cross section of the semiconductor device of the same embodiment provided by epitaxial growth.

Note that while the above fabrication method employs impurities injected and thermally diffused to provide each diffusion region, it may alternatively employ epitaxial growth to do so. A semiconductor device provided through epitaxial growth has a structure as shown in FIG. 21. Each diffusion region shown in FIG. 21 that corresponds to a diffusion region shown in FIG. 4 is identically denoted and will not be described repeatedly. It should be noted in particular that the semiconductor device fabricated by epitaxial growth does not have the LOCOS film.

First Exemplary Variation

Figure 22:
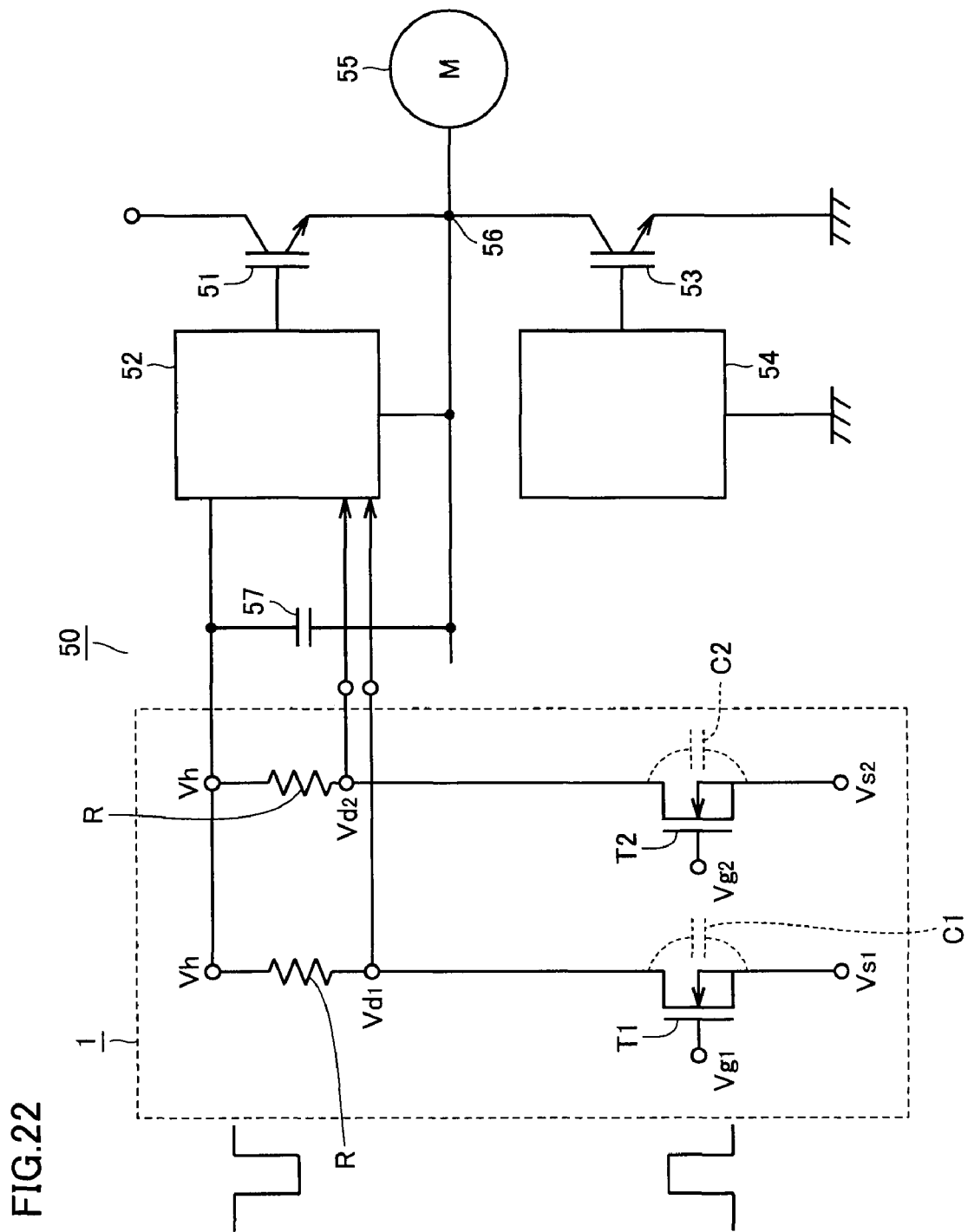
FIG. 22 shows a drive control circuit in the same embodiment that includes a semiconductor device of a first exemplary variation.

Between field effect transistor T's drain and source there exists parasitic capacitance. The parasitic capacitance is a factor of erroneous operation. Accordingly, to remove such problem, there is provided a circuit having two field effect transistors T1 and T2 connected in parallel to cancel their respective parasitic capacitances C1 and C2, as shown in FIG. 22.

Figure 23:
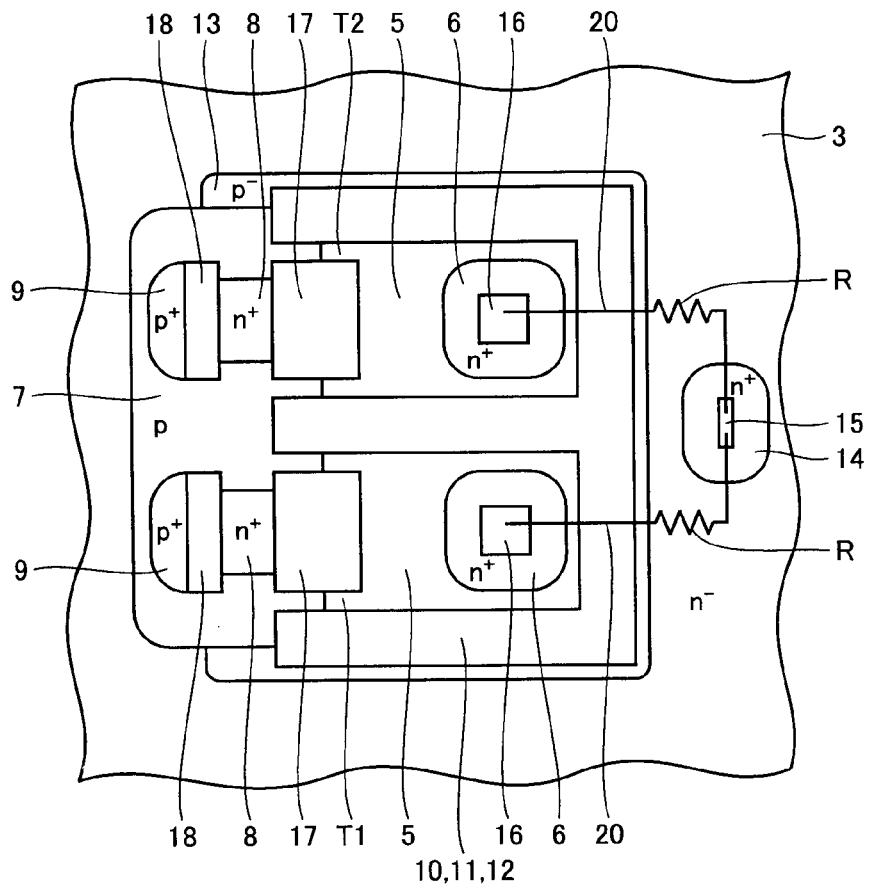
FIG. 23 is a plan view of the semiconductor device shown in FIG. 22 in the same embodiment.

In this case, as shown in FIG. 23, two field effect transistors T1 and T2 are arranged side by side. Field effect transistors T1 and T2 have their respective source regions (n⁺ diffusion region 8) provided in the region of p diffusion region 7 and spaced from each other, and their respective drain regions (n⁻ diffusion region 5) electrically isolated by trench 10. The other components are similar to those of the structure shown in FIGS. 3 and 4. Accordingly they are identically denoted and will not be described repeatedly.

This semiconductor device 1 also has trench 10 having insulator 12 introduced therein, that extends toward a region having p diffusion region 7 and thus surrounds a side portion of n⁻ diffusion region 5, as has been described above. Thus at the side portion of n⁻ diffusion region 5 there does not exist a pn junction and distance S between n⁺ diffusion region 6 and trench 10 can be reduced. This ensures that semiconductor device 1 has sufficient breakdown voltage and is also miniaturized.

Second Exemplary Variation

Figure 24:
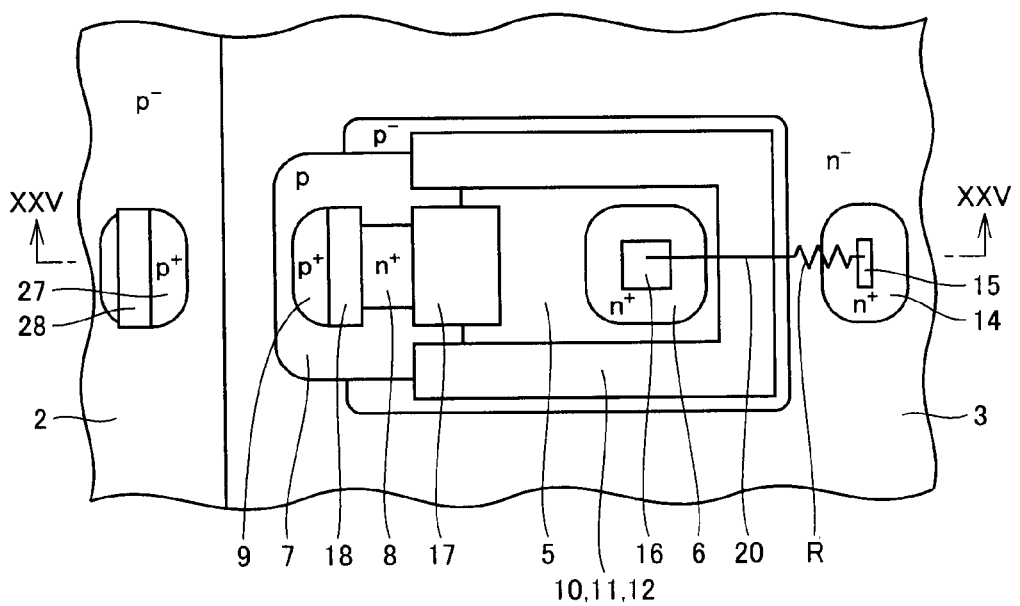
FIG. 24 is a plan view of a semiconductor device of the same embodiment in a second exemplary variation.
Figure 25:
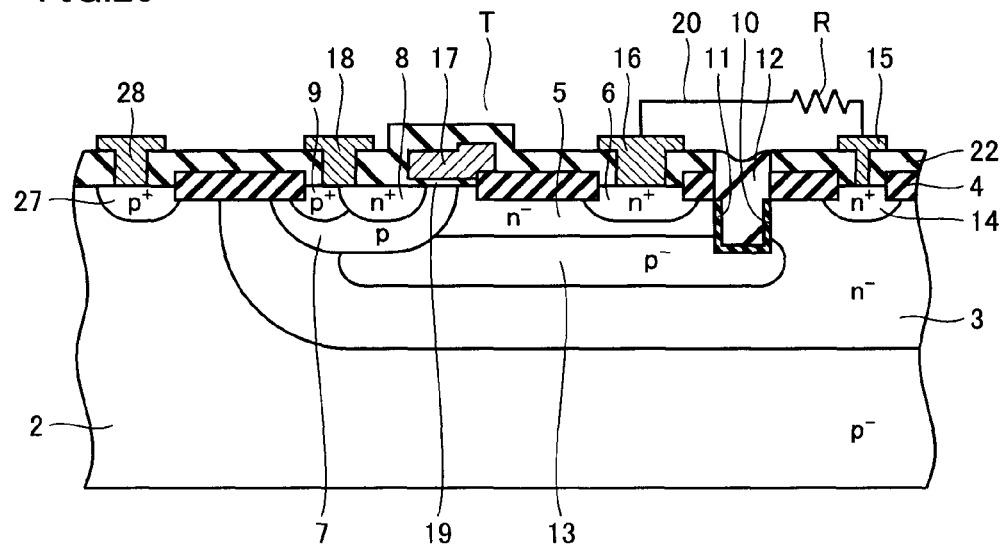
FIG. 25 is a cross section in the same embodiment, as taken along a line XXV-XXV shown in FIG. 24.

Semiconductor device 1 as described above has n⁻ type semiconductor region 3 having a surface having a field effect transistor or the like, by way of example. Alternatively, as shown in FIGS. 24 and 25, it may have such n⁻ type semiconductor region 3 at a surface of a p type semiconductor substrate 2 and in a vicinity of the surface. In this semiconductor device the p type semiconductor substrate has a surface provided with a p⁺ diffusion region 27 and p⁺ diffusion region 27 has a surface provided with an electrode 28. The remainder in configuration is similar to that shown in FIG. 3 or 4. Accordingly, identical components are identically denoted and will not be described repeatedly. Note that the semiconductor substrate of the second conduction type as recited in claim 5 corresponds to p type semiconductor substrate 2.

Figure 26:
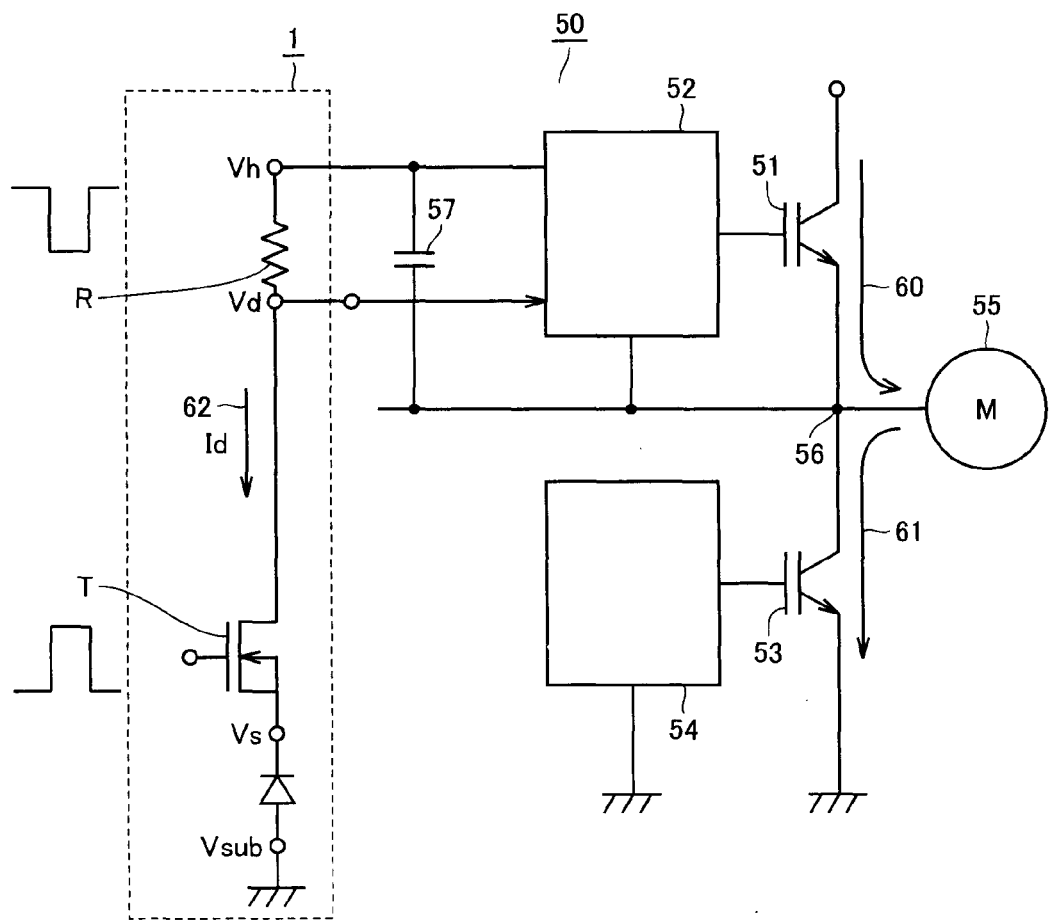
FIG. 26 shows a drive control circuit in the same embodiment that includes the semiconductor device of the second exemplary variation.

This semiconductor device allows the potential (Vsub) of p type semiconductor substrate 2 and the source's potential (Vs) to be electrically separated by a magnitude corresponding to a punch through voltage in n⁻ type semiconductor region 3 sandwiched between p type semiconductor substrate 2 and p diffusion region 7. Thus, as shown in FIG. 26, a logic signal provided with reference to the source's potential (Vs) different from the potential (Vsub) of p type semiconductor substrate 2 will be converted to that provided with reference to high potential Vh.

Figure 27:
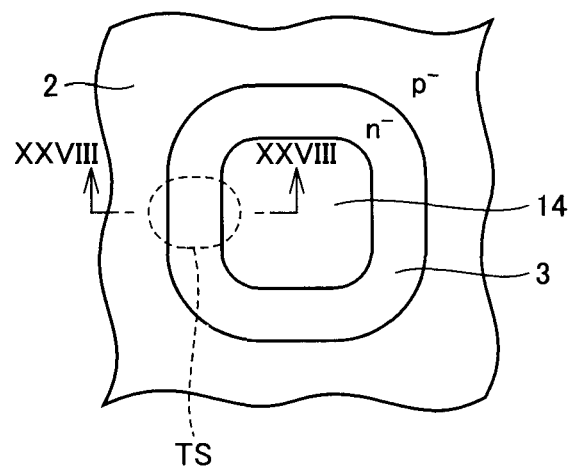
FIG. 27 is a plan view of the semiconductor device of the second exemplary variation and a vicinity thereof in the same embodiment.
Figure 28:
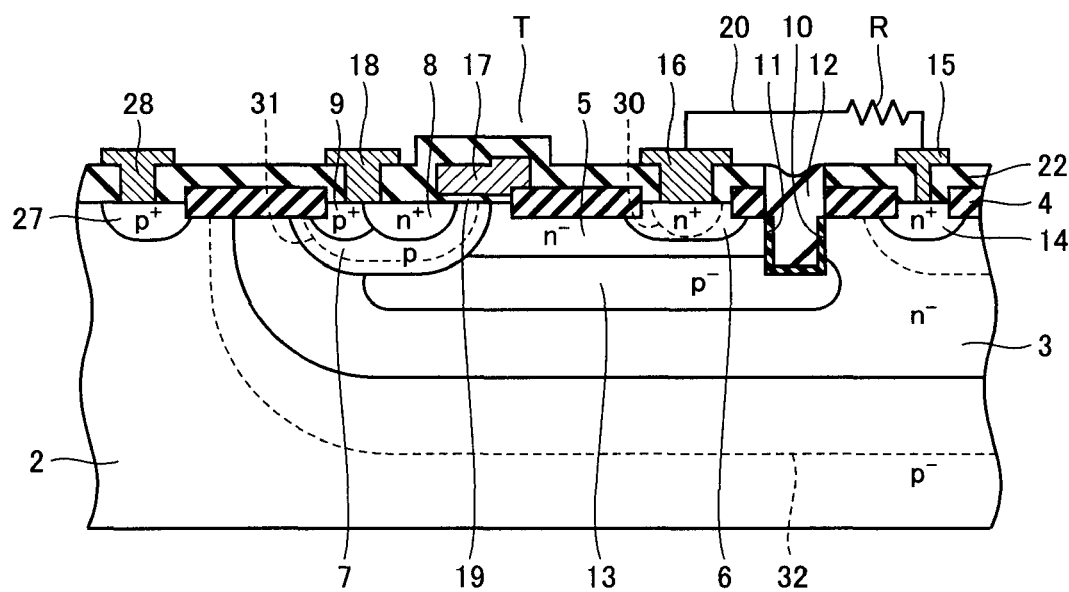
FIG. 28 is a cross section in the same embodiment in the off state for illustrating the operation of the semiconductor device of the second exemplary variation.

Furthermore, as shown in FIG. 27, a region TS provided with a field effect transistor or the like may be provided around n⁻ diffusion region 3, and, as shown in FIG. 28, when field effect transistor T is in the off state n⁻ diffusion region 3 may completely be depleted and p⁻ buried layer 13 and n⁻ diffusion region 5 immediately overlying p⁻ buried layer 13 may also completely be depleted. Depletion layer ends 30, 31 and 32 indicate that condition and a portion of n⁻ diffusion region 3 that immediately underlies p⁻ buried layer 13 completely depletes.

Such configuration allows the transistor, with breakdown voltage held, to operate as a high breakdown voltage multiple junction field effect transistor (JFET) as proposed for example in U.S. Pat. No. 6,468,847 B1. Thus the breakdown voltage between p⁻ substrate 2 and n⁻ diffusion region 3 can be prevented from being significantly impaired and a logic signal can be converted within the range of the breakdown voltage to a logic signal provided with reference to high potential Vh.

In this structure, in particular, p diffusion region 7 and n⁻ diffusion region 3 do not provide a junction located at a corner of n⁻ diffusion region 5. When such structure is compared with a structure having such a junction surrounding n⁻ diffusion region 5, the former can alleviate an electric field otherwise concentrated at the corner and thus facilitate ensuring a breakdown voltage of approximately at least 500 V. As a result a logic signal can be converted to a logic signal of high potential with a potential difference of at least 500 V.

Figure 29:
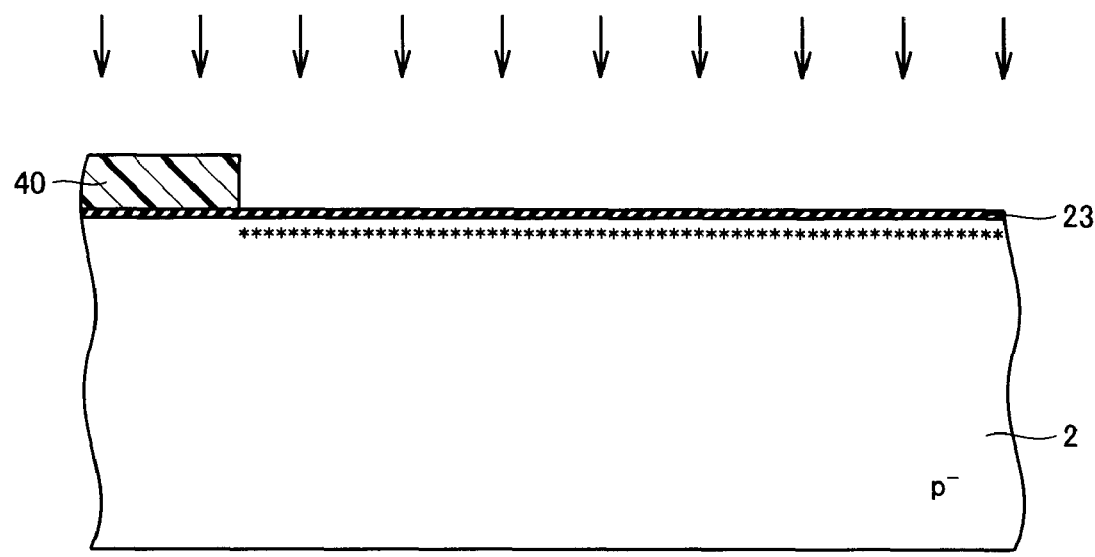
FIG. 29 is a cross section for illustrating one step of a method of fabricating the semiconductor device of the second exemplary variation of the same embodiment.

The semiconductor device of the second exemplary variation is fabricated in a method, by way of example, as will be described hereinafter. As shown in FIG. 29, initially, silicon nitride film 23 is provided on a surface of p type semiconductor substrate 2 for providing a LOCOS film. On a surface of silicon nitride film 23 a resist pattern 40 is provided. With resist pattern 40 used as a mask, phosphorus (P) is injected in a dose for example of approximately $1 \times 10^{12}$ to $3 \times 10^{12}$ cm$^{-2}$. Subsequently resist pattern 40 is removed.

Figure 30:
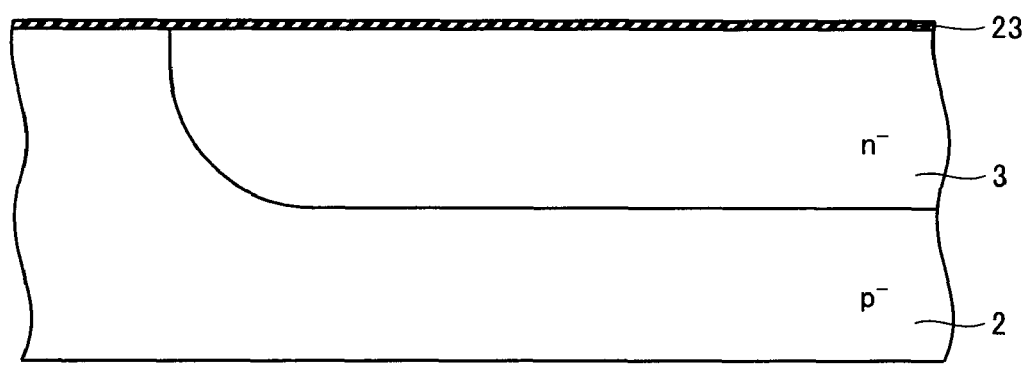
FIGS. 30-40 are cross sections for illustrating steps performed after those shown in FIGS. 29-39, respectively, in the same embodiment.
Figure 31:
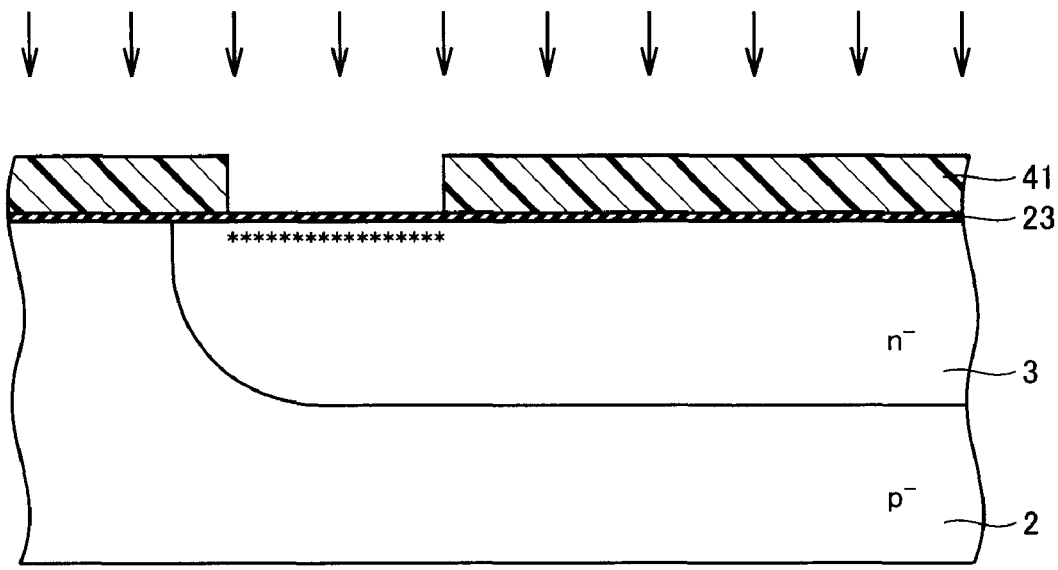

Then, as shown in FIG. 30, the intermediate product is annealed at a predetermined temperature to diffuse the injected phosphorus to provide n⁻ diffusion region 3. Then, as shown in FIG. 31, on a surface of silicon nitride film 23 a resist pattern 41 is provided. With resist pattern 41 used as a mask, boron (B) is injected in a dose for example of approximately $1 \times 10^{13}$ to $5 \times 10^{13}$ cm$^{-2}$. Subsequently resist pattern 41 is removed.

Figure 32:
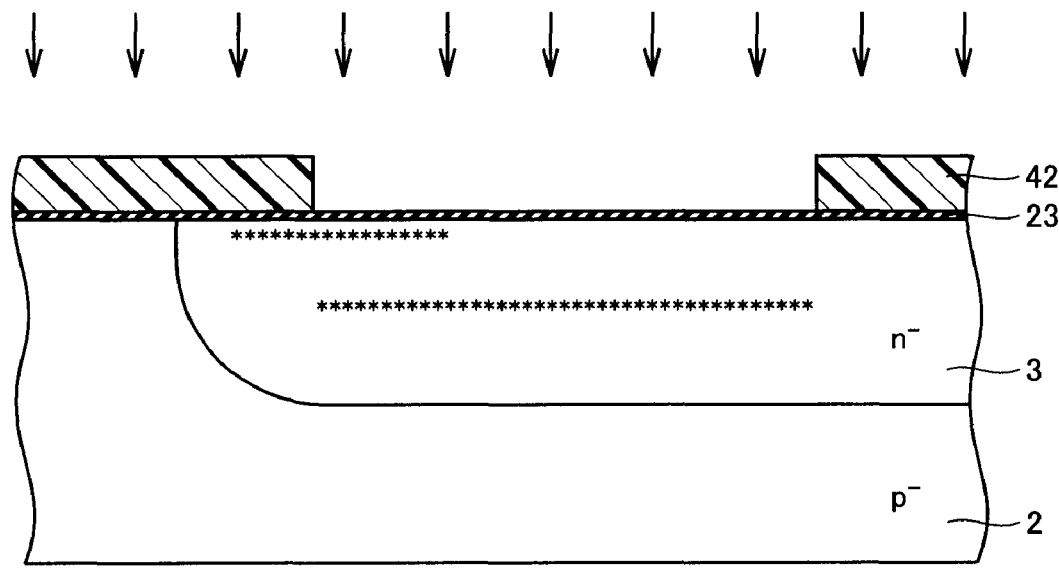

Then, as shown in FIG. 32, on a surface of silicon nitride film 23 a resist pattern 42 is provided. With resist pattern 42 used as a mask, boron (B) is injected in a dose for example of approximately $1 \times 10^{12}$ to $3 \times 10^{12}$ cm$^{-2}$ by high energy injection from a surface of n⁻ type semiconductor region 3 into a region to a depth of approximately 2 μm to 5 μm. Subsequently resist pattern 42 is removed.

Figure 33:
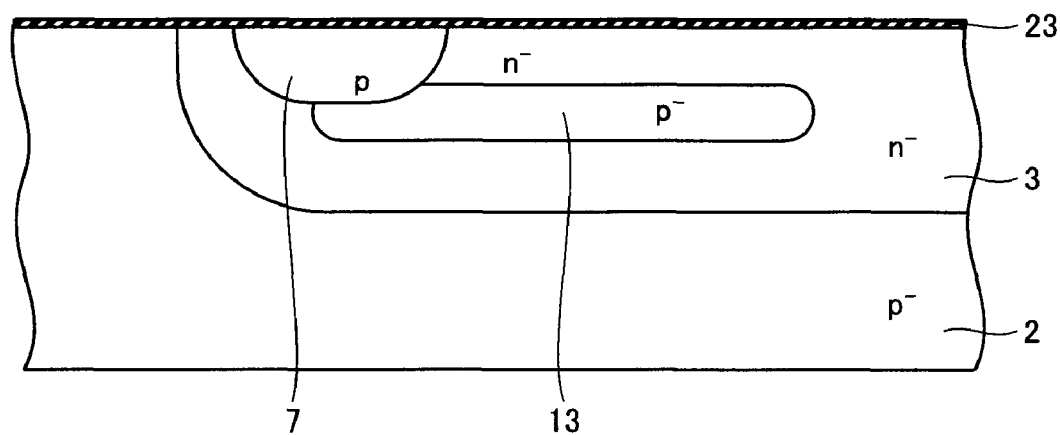
Figure 34:
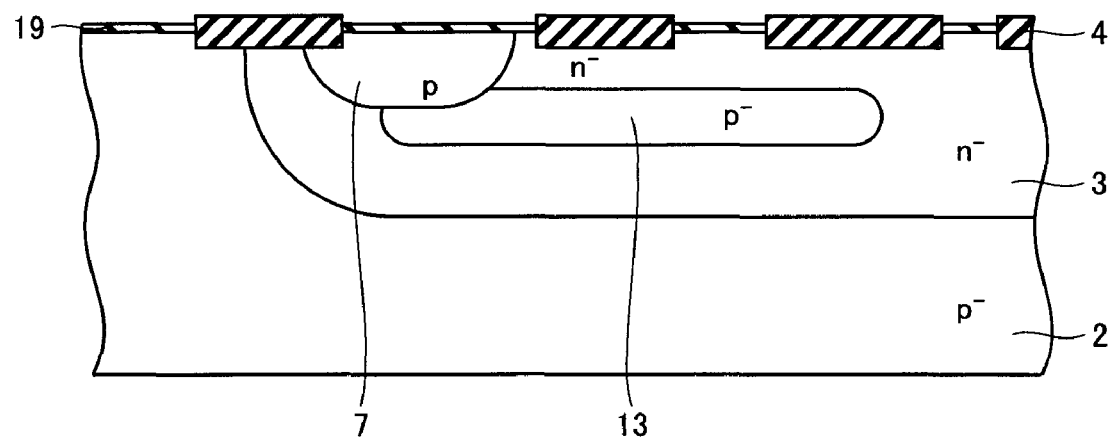

Then, as shown in FIG. 33, the intermediate product is annealed at a predetermined temperature to diffuse the injected boron to provide p diffusion region 7 and p⁻ buried layer 13. Then silicon nitride film 23 has a predetermined region removed to expose a surface of n⁻ type semiconductor region 3. Then the intermediate product is oxidized, as predetermined, to provide LOCOS film 4 at the exposed surface of n⁻ type semiconductor region 3 (see FIG. 34). Thereafter silicon nitride film 23 that remains is removed to expose a surface of n⁻ type semiconductor region 3. Then the intermediate product is thermally oxidized, as predetermined, to provide gate oxide film 19 at the exposed surface of n⁻ type semiconductor region 3, as shown in FIG. 34.

Figure 35:
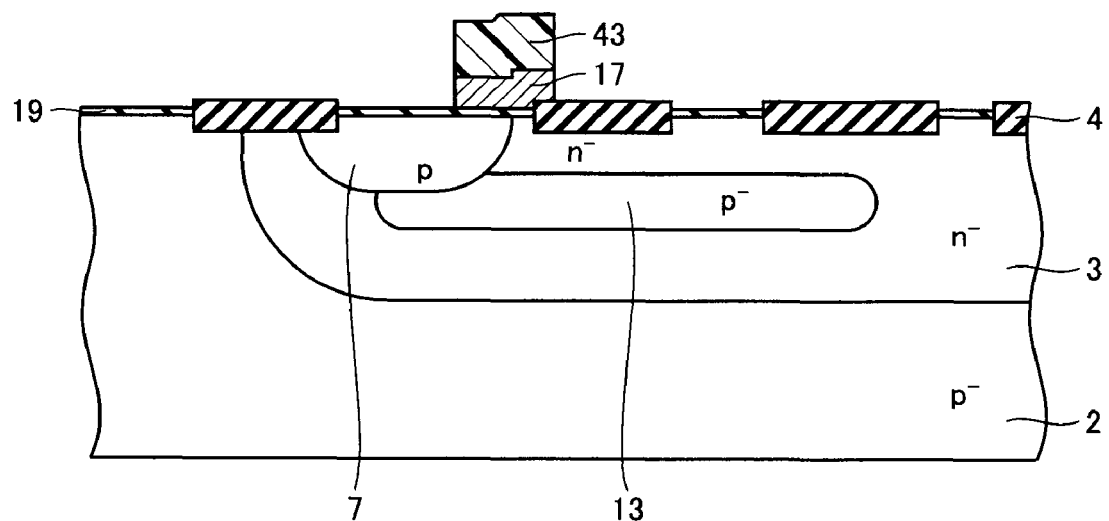
Figure 36:
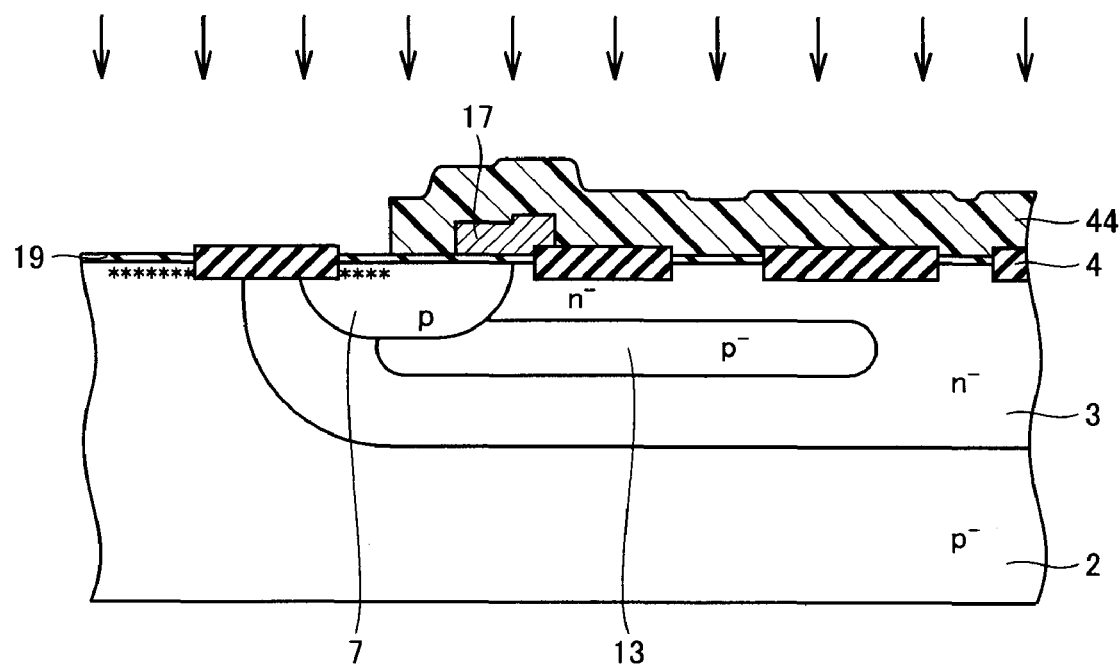

Then on a surface of p⁻ type semiconductor substrate 2 a polysilicon film (not shown) is provided. On a surface of the polysilicon film a resist pattern 43 is provided (see FIG. 35). With resist pattern 43 used as a mask, the polysilicon film is anisotropically etched to provide gate electrode 17, as shown in FIG. 35. Thereafter resist pattern 43 is removed. Then as shown in FIG. 36 a resist pattern 44 is provided. With resist pattern 44 used as a mask, boron (B) is injected in a dose for example of approximately $3 \times 10^{15}$ to $6 \times 10^{15}$ cm$^{-2}$ p diffusion region 7 and a predetermined region of p⁻ type semiconductor substrate 2. Subsequently resist pattern 44 is removed.

Figure 37:
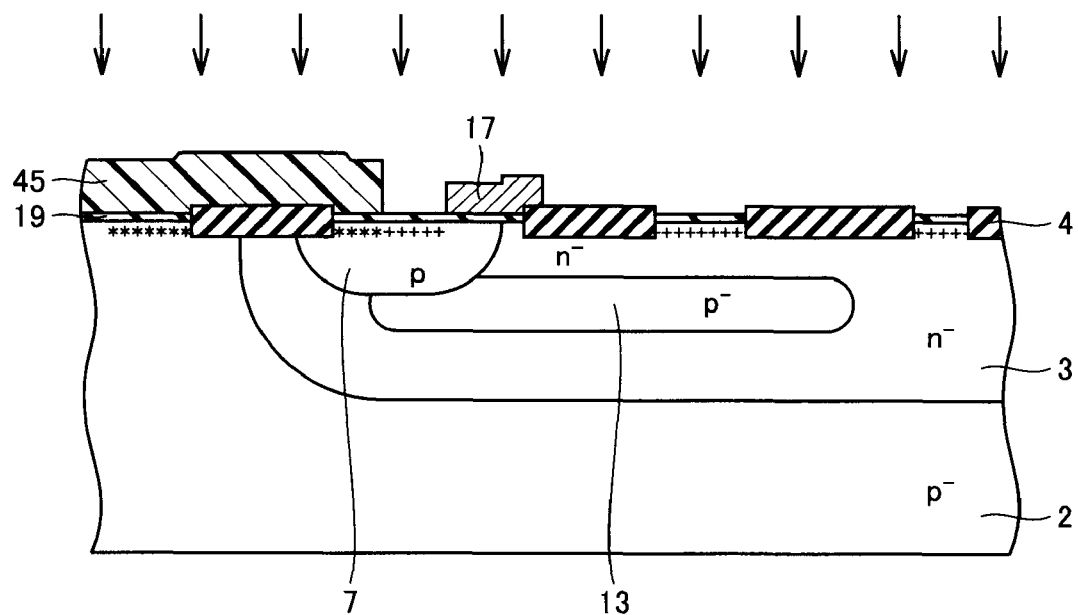

Then as shown in FIG. 37 a resist pattern 45 is provided. With resist pattern 45 used as a mask, phosphorus (P) is injected in a dose for example of approximately $3 \times 10^{15}$ to $6 \times 10^{15}$ cm$^{-2}$ into n⁻ type semiconductor region 3. Subsequently resist pattern 45 is removed. Then gate electrode 17 is covered with insulation film 22. Thereafter the intermediate product is annealed, as predetermined, to diffuse the injected boron and phosphorus to provide p⁺ diffusion regions 9 and 27 and n⁺ diffusion regions 8, 6 and 14 (see FIG. 38).

Figure 38:
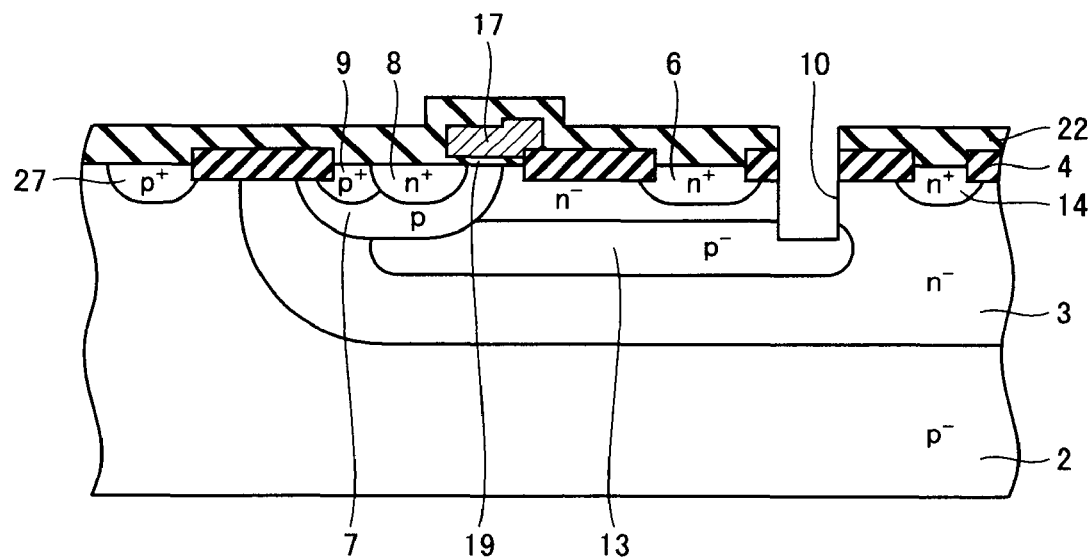

Then a portion of insulation film 22 that is located in a region provided with a trench is removed to provide an insulation film mask for forming the trench. Then, as shown in FIG. 38, with the insulation film mask used as a mask, LOCOS film 4 and n⁻ type semiconductor region 3 are anisotropically etched to provide trench 10 reaching p⁻ buried layer 13.

Figure 39:
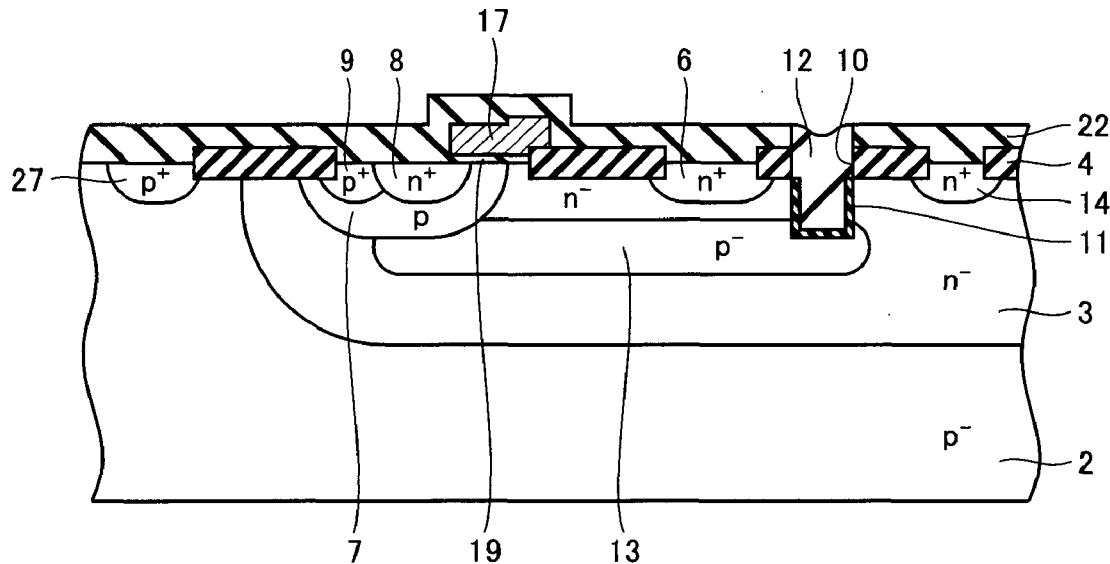

Then as shown in FIG. 39 the intermediate product is oxidized, as predetermined, to provide thermal oxide film 11 at a surface of the n⁻ semiconductor region that is exposed at a sidewall of trench 10. Then a TEOS film (not shown) is provided on insulation film 22 and thus introduced into trench 10. The TEOS film is anisotropically etched away from a top surface of insulation film 22 while the TEOS film remains in trench 10. Trench 10 is thus provided therein with insulator 12 of the TEOS film.

Figure 40:
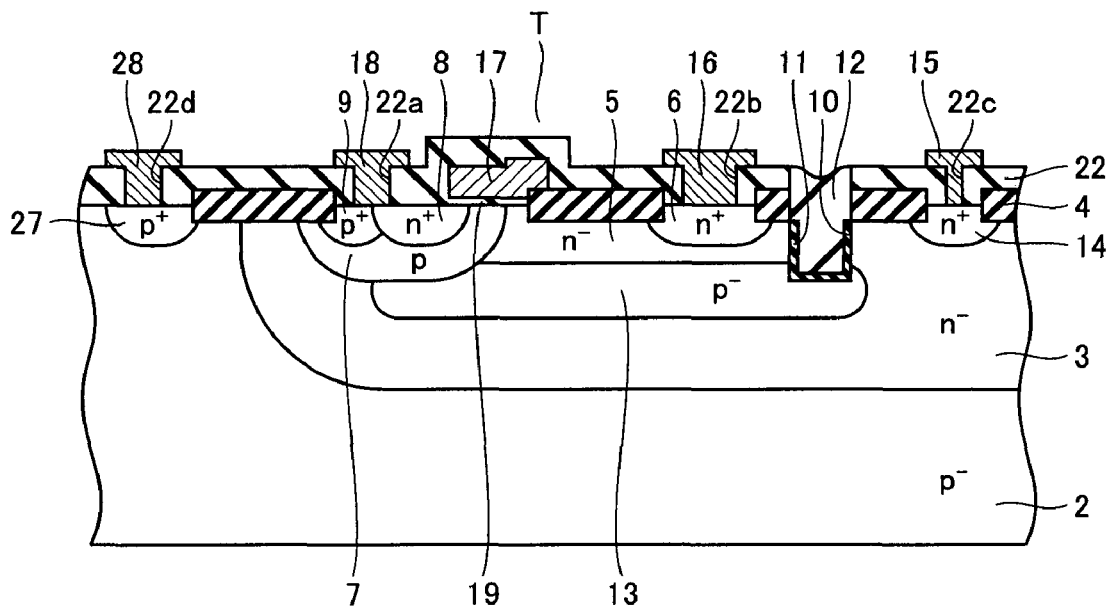

Then as shown in FIG. 40 insulation film 22 is subjected to photolithography and processed, as predetermined, to form openings 22a, 22b, 22c, 22d for providing an electrode. Then sputtering is performed to deposit an aluminum-silicon (Al—Si) film (not shown) on insulation film 22 to introduce it into openings 22a, 22b, 22c, 22d. The aluminum-silicon film is subjected to photolithography and processed, as predetermined, to provide drain electrode 16, source electrode 18 and electrodes 15 and 28. The semiconductor device shown in FIGS. 24 and 25 is thus completed.

Figure 41:
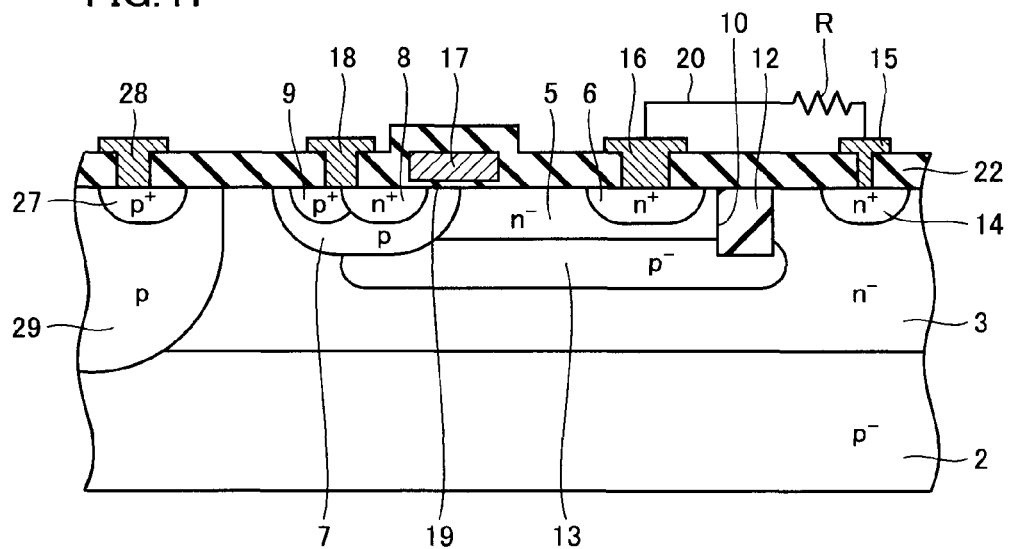
FIG. 41 is a cross section of a semiconductor device of the second exemplary variation of the same embodiment that is fabricated by epitaxial growth.

Note that while the above fabrication method employs impurities injected and thermally diffused to provide each diffusion region by way of example, it may alternatively employ epitaxial growth to do so. A semiconductor device provided through epitaxial growth has a structure as shown in FIG. 41. Each diffusion region shown in FIG. 41 that corresponds to a diffusion region shown in FIG. 25 is identically denoted and will not be described repeatedly. It should be noted in particular that the semiconductor device fabricated by epitaxial growth does not have the LOCOS film. Furthermore, p$^+$ diffusion region 27 is provided at a surface of p diffusion region 29 and in a vicinity of the surface.

Second Embodiment

Another example of the semiconductor device applied to the drive control circuit will be described hereinafter. The above described semiconductor device (see FIGS. 3 and 4) has trench 10 surrounding n$^-$ diffusion region 5, as seen in a plane, except for a region having p diffusion region 7. In contrast, the present semiconductor device has a p diffusion region surrounding an n$^-$ diffusion region, as seen in a plane. Furthermore a p$^-$ buried layer has an impurity concentration set to be a predetermined impurity concentration so that when a field effect transistor is in the off state the p$^-$ buried layer is completely depleted.

Figure 42:
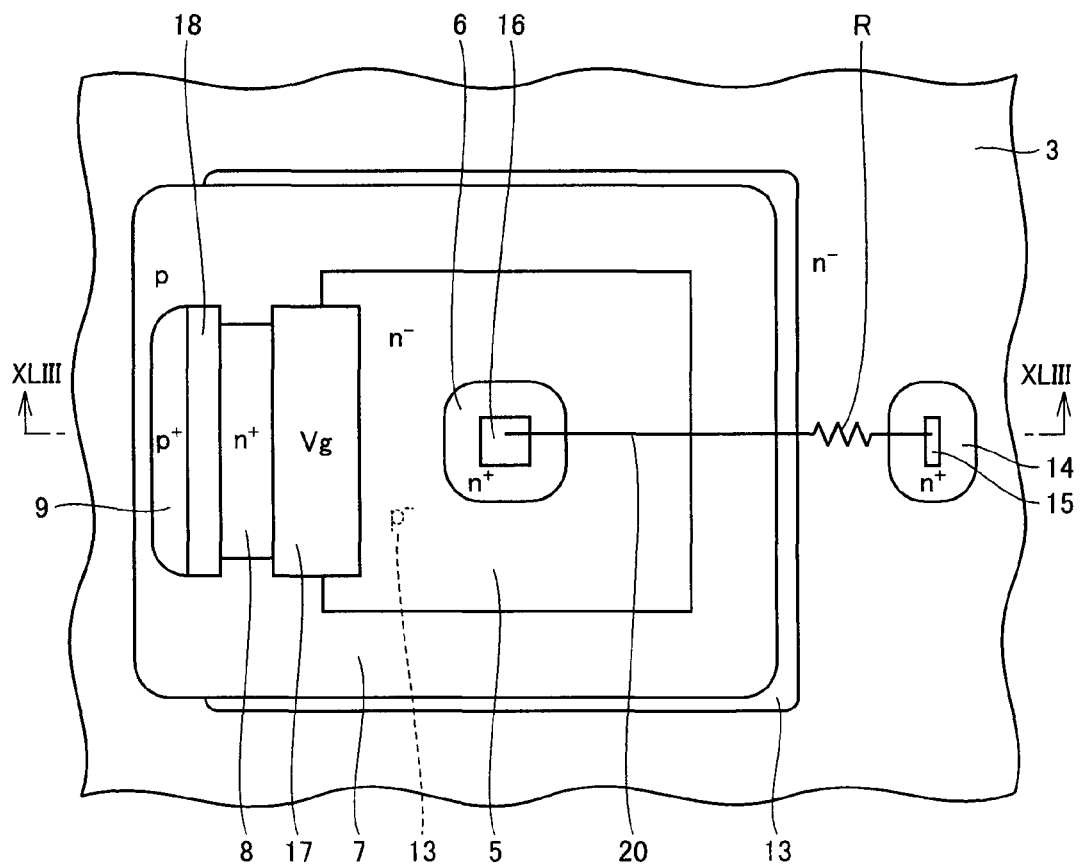
FIG. 42 is a plan view of the present semiconductor device in a second embodiment.
Figure 43:
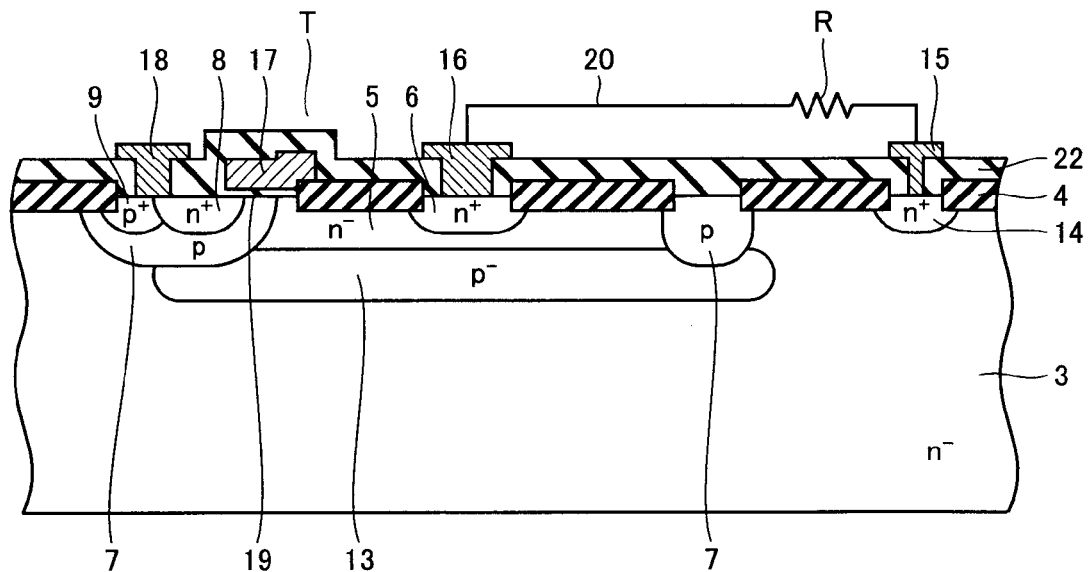
FIG. 43 is a cross section in the same embodiment, as taken along a line XLIII-XLIII shown in FIG. 42.

As shown in FIGS. 42 and 43, n$^-$ type semiconductor region 3 has a main surface provided with LOCOS film 4. N$^-$ type diffusion region (n$^-$ diffusion region) 5 serving as the drain region of field effect transistor T is provided in n$^-$ type semiconductor region 3 from a surface of a predetermined region to a predetermined depth. N$^-$ diffusion region 5 extends from one side to an other side. N$^+$ type diffusion region (n$^+$ diffusion region) 6 is provided at a surface of n$^-$ diffusion region 5 and in a vicinity of the surface. Drain electrode 16 is provided on a surface of n$^+$ diffusion region 6.

N$^-$ diffusion region 5 is surrounded by and in contact with p type diffusion region (p diffusion region) 7. P diffusion region 7 extends from a surface of n$^-$ type semiconductor region 3 to a predetermined depth to space a side portion of n$^-$ diffusion region 5 and n$^-$ type semiconductor region 3 from each other. In p diffusion region 7 n$^+$ type diffusion region (n$^+$ diffusion region) 8 is provided to serve as the source region of field effect transistor T. N$^+$ diffusion region 8 is provided in a region extending from a surface of p diffusion region 7 to a depth shallower than the bottom of p diffusion region 7 so that n$^+$ diffusion region 8 is spaced from n$^-$ type semiconductor region 3 by p diffusion region 7. Furthermore in p diffusion region 7 p$^+$ type diffusion region (p$^+$ diffusion region) 9 is provided. Source electrode 18 is provided in contact with n$^+$ diffusion region 8 and p$^+$ diffusion region 9.

Immediately under the drain region, or n$^-$ diffusion region 5, p$^-$ type buried layer (p$^-$ buried layer) 13 is provided in contact with a bottom of n$^-$ diffusion region 5. P$^-$ buried layer 13 extends from a region immediately underlying one bottom of p diffusion region 7 to a region immediately underlying an other bottom of p diffusion region 7 to space a bottom of n$^-$ diffusion region 5 and n$^-$ type semiconductor region 3 from each other.

Furthermore, a region of n$^-$ type semiconductor region 3 that is spaced from p diffusion region 7 is provided with n$^+$ type diffusion region (n$^+$ diffusion region) 14 receiving a predetermined high potential. Electrode 15 is provided on a surface of n$^+$ diffusion region 14. Electrode 15 and drain electrode 16 are electrically connected together by interconnect 20 provided with resistor R. Gate electrode 17 is provided on a surface of a portion of p diffusion region 7 that is sandwiched between n$^+$ diffusion region 8 and n$^-$ diffusion region 5, with gate insulation film 19 posed therebetween. Gate electrode 17 is covered by insulation film 22. The present semiconductor device 1 is thus configured.

Note that the first semiconductor region of the first conduction type in another semiconductor device described in the Summary of the Invention section corresponds to n$^-$ type semiconductor region 3 and the second semiconductor region of the second conduction type corresponds to n$^-$ diffusion region 5. Furthermore the third semiconductor region of the second conduction type corresponds to p diffusion region 7 and the fourth semiconductor region of the first conduction type corresponds to n$^+$ diffusion region 8. The fifth semiconductor region of the second conduction type corresponds to p$^-$ buried layer 13 and the sixth semiconductor region of the first conduction type corresponds to n$^+$ diffusion region 14.

Figure 44:
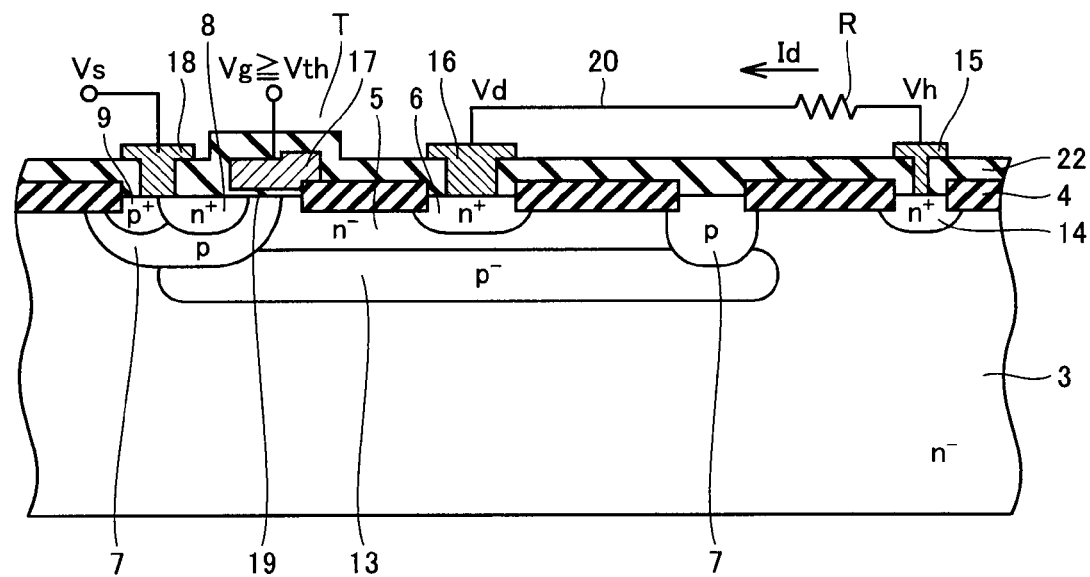
FIGS. 44 and 45 are cross sections in the same embodiment in the on and off states, respectively, for illustrating the semiconductor device's operation.

The above described semiconductor device 1 operates as will be described hereinafter. Initially, in the on state, as shown in FIG. 44, field effect transistor T receives a predetermined voltage of at least a threshold voltage, i.e., Vg≧Vth, at gate electrode 17. When the predetermined voltage is applied to gate electrode 17, a channel region (not shown) is formed in p diffusion region 7 immediately underlying gate electrode 17 and a fixed current Id flows from n$^+$ diffusion region 14 through interconnect 20 and thus from the drain region (n$^-$ diffusion region 5) to the source region (n$^+$ diffusion region 8). As the fixed current Id flows, a fixed voltage drop is caused across resistor R with reference to potential Vh. Thus a logic signal provided with reference to potential Vs is transmitted as a logic signal provided with reference to potential Vh. The transmitted logic signal will be transmitted to first driver circuit 52 as a signal applied to turn on/off first IGBT 51.

Figure 45:
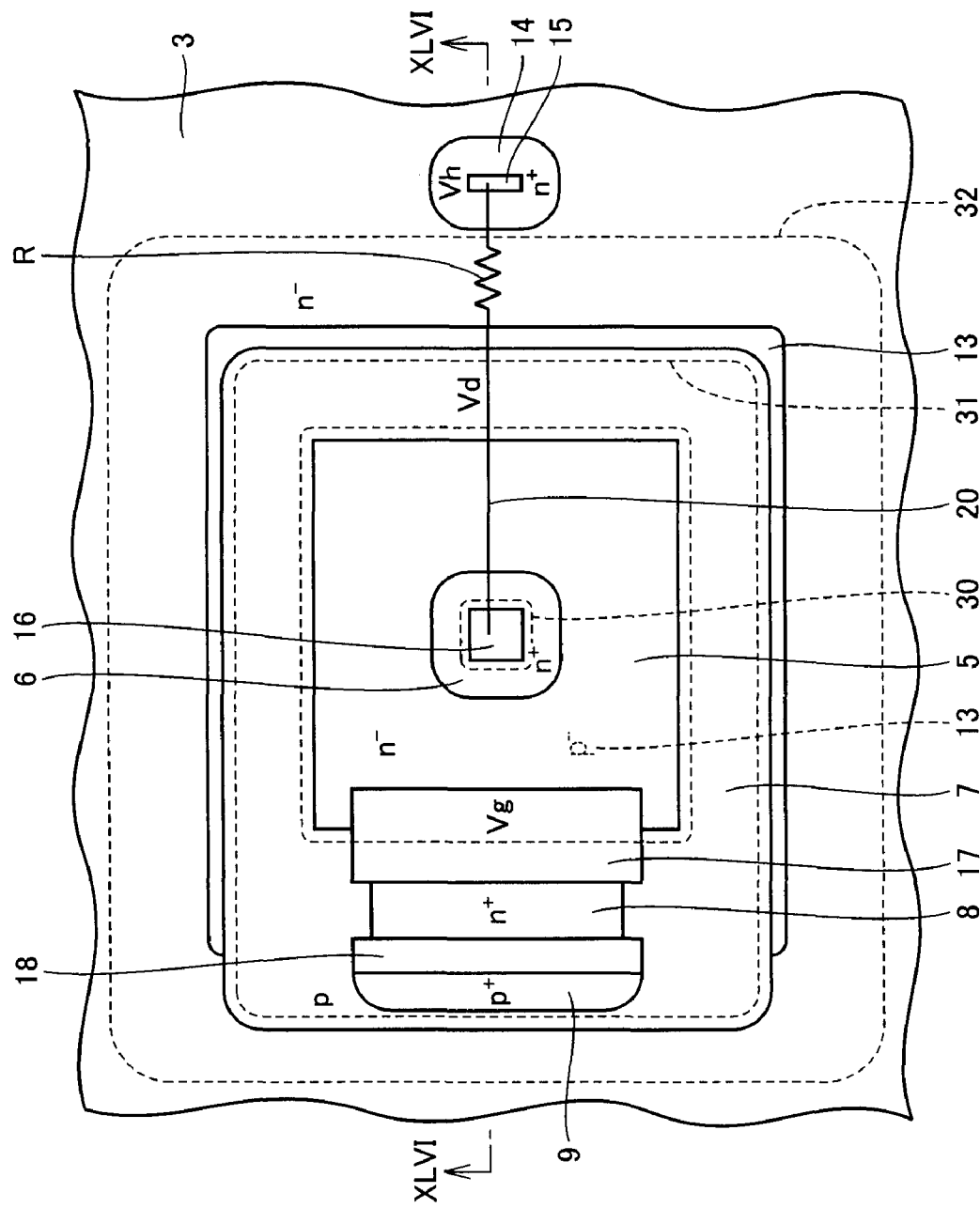
Figure 46:
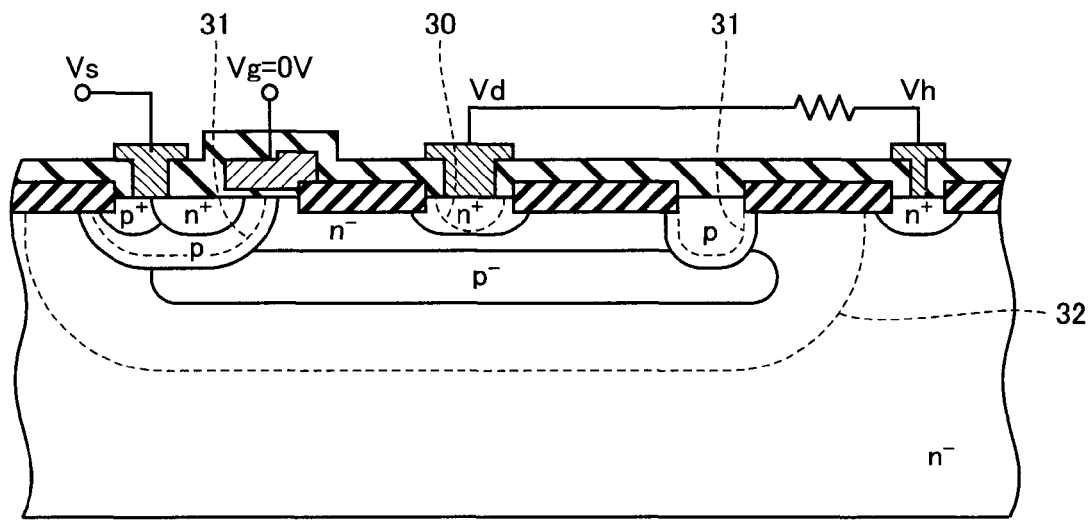
FIG. 46 is a cross sections taken along a line XLVI-XLVI shown in FIG. 45 for illustrating the operation of the semiconductor device of the same embodiment.

In the off state, as shown in FIGS. 45 and 46, field effect transistor T does not receive voltage at gate electrode 17, i.e., Vg=0V. When at the time high potential Vh (a positive bias) is applied to electrode 15, potential Vd of drain electrode 16 also attains the same high potential and the off state is held. Thus a positive bias is applied via n$^+$ diffusion regions 6 and 14 to n$^-$ type semiconductor region 3 and the drain region or n$^-$ diffusion region 5 to allow a depletion layer (depletion layer A) to extend from an interface of a top portion of p$^-$ buried layer 13 and n$^-$ diffusion region 5 (interface A) toward p$^-$ buried layer 13 and a depletion layer (depletion layer B) to extend from an interface of a bottom portion of p$^-$ buried layer 13 and n$^-$ type semiconductor region 3 (interface B) toward p$^-$ buried layer 13.

In this semiconductor device p$^-$ buried layer 13 has an impurity concentration set to be a relatively low impurity concentration corresponding to that of n$^-$ diffusion region 5 multiplied by 3 to 10, e.g., up to approximately $1 \times 10^{17}$ cm$^{-3}$, to allow depletion layers A and B to join to completely deplete p$^-$ buried layer 13.

Thus in the off state p$^-$ buried layer 13 is finally, completely depleted and in that depleted condition p$^-$ buried layer 13 immediately underlying n$^+$ diffusion region 6 has a potential higher than potential Vs of the source region. Thus the relative potential difference between n$^+$ diffusion region 6 and p$^-$ buried layer 13 immediately thereunder decreases and a high breakdown voltage of approximately 500 V can be obtained. Furthermore the separation breakdown voltage between potential Vd and potential Vh can be obtained from a potential barrier internal to p$^-$ buried layer 13.

Figure 47:
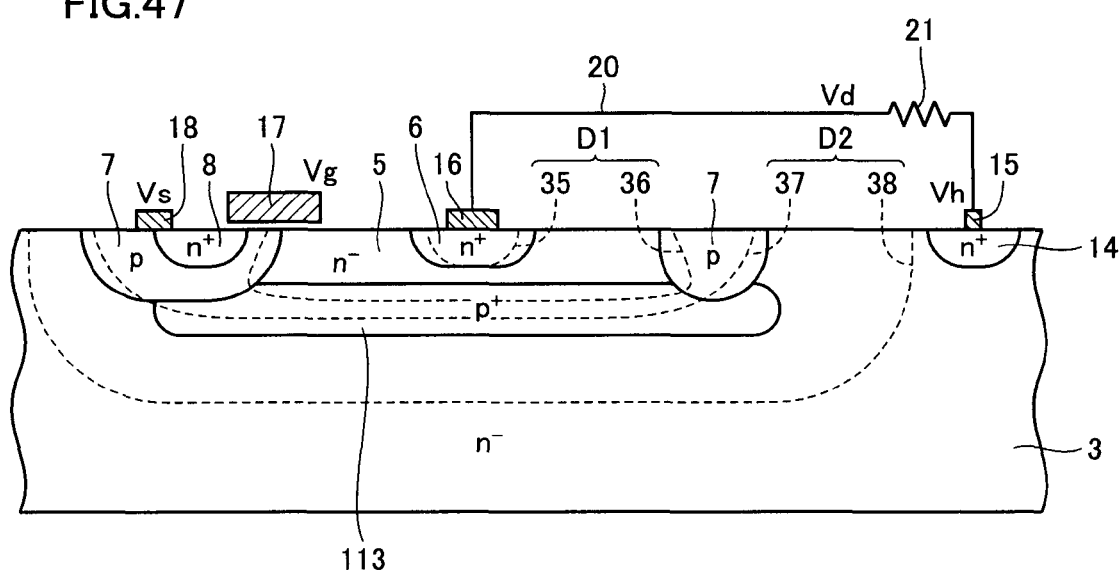
FIG. 47 is a cross section of a semiconductor device of a comparative example in the off state.

This breakdown voltage will now be described in relation with a structure of a semiconductor device of a comparative example. As shown in FIG. 47, the semiconductor device of the comparative example has p$^+$ buried layer 113 having an impurity concentration set to be higher than that of p$^-$ buried layer 13. For example it is set at approximately $1 \times 10^{18}$ to $1 \times 10^{19}$ cm$^{-3}$. The components of the semiconductor device of the comparative example that are identical to those of the semiconductor device shown in FIG. 43 are identically denoted.

Figure 48:
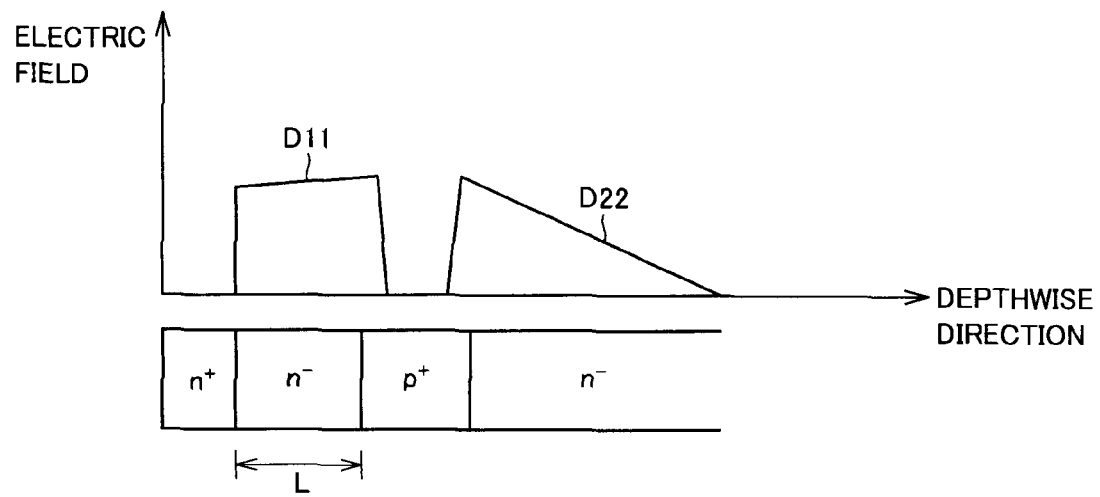
FIG. 48 shows a relationship between a depletion layer's electrical field and depthwise direction when the semiconductor device of the comparative example is in the off state.

In the off state a depletion layer D1 (between depletion layer ends 35 and 36) will extend from an interface of a top portion of p$^+$ buried layer 113 and n$^-$ diffusion region 5 and a depletion layer D2 (between depletion layer ends 37 and 38)

will also extend from an interface of a bottom portion of $p^+$ buried layer 113 and $n^-$ type semiconductor region 3. As $p^+$ buried layer 113 has a relatively high impurity concentration, depletion layer ends 36 and 37 do not join. FIG. 48 represents an electric field in intensity as seen depthwise from $n^+$ diffusion region 6 in the off state. Graphs 11 and 12 indicate electric fields in depletion layers D1 and D2, respectively.

The semiconductor device of the comparative example will have a breakdown voltage depending on that of depletion layer D1. More specifically, it corresponds to the area of a range (ED1) surrounded by a graph D11. Depletion layer D1 has end 36 in $p^+$ buried layer 113. A voltage corresponding to a portion of depletion layer D1 that enters $p^+$ buried layer 113 is at most approximately 50% of that corresponding to the entirety of depletion layer D1 and the electric field of $n^-$ diffusion region 5 is Emax at maximum. Accordingly, if $n^-$ diffusion region 5 has a depthwise distance L then a total breakdown voltage provided by range ED1 is estimated to be approximately Emax×L×1.5 at maximum.

Herein Emax is approximately $2.5 \times 10^5$ V/cm and $n^-$ diffusion region 5 has length L of approximately 3 μm. Accordingly region ED1 provides a breakdown voltage estimated to be up to approximately 113 V and the semiconductor device of the comparative example will have a breakdown voltage having an upper limit slightly exceeding 100 V. For Emax of $2.5 \times 10^5$ V/cm, if $n^-$ diffusion region 5 has an impurity concentration of approximately $7 \times 10^{15}$ cm$^{-3}$, $n^-$ diffusion region 5 has depthwise distance L estimated to be 2.3 μm at maximum, and if $n^-$ diffusion region 5 has an impurity concentration of approximately $5 \times 10^{15}$ cm$^{-3}$, $n^-$ diffusion region 5 has depthwise distance L estimated to be 3.2 μm at maximum. Thus when the breakdown voltage of the present semiconductor device is compared with that of the semiconductor device of the comparative example (i.e., approximately 113 V), the former can be estimated to be approximately 4.5 to 5 times the latter.

Figure 49:
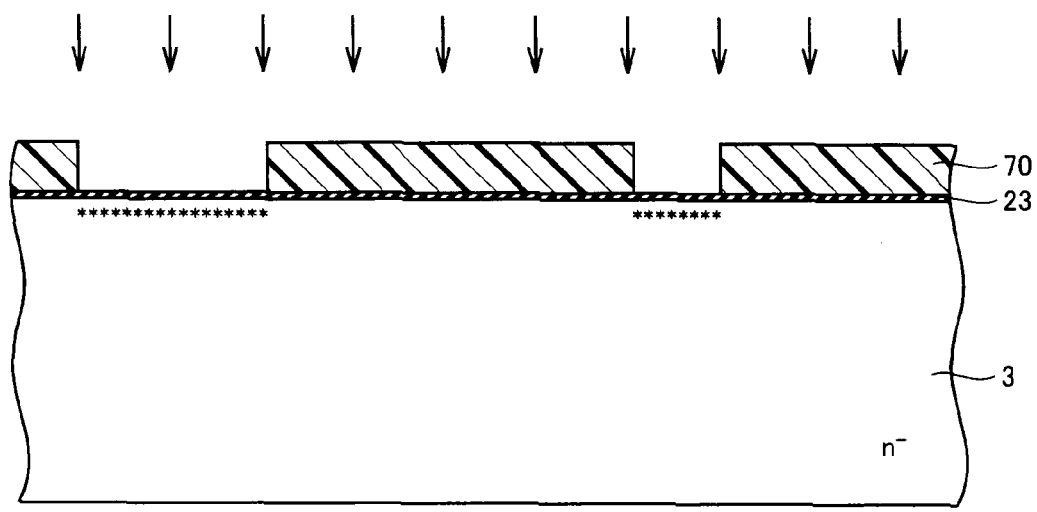
FIG. 49 is a cross section for illustrating one step of a method of fabricating the semiconductor device shown in FIGS. 42 and 43 in the same embodiment.

The above described semiconductor device is fabricated in a method, by way of example, as will be described hereinafter. As shown in FIG. 49, initially silicon nitride film 23 is provided on a surface of $n^-$ type semiconductor region 3 for providing a LOCOS film. On a surface of silicon nitride film 23 a resist pattern 70 is provided. With resist pattern 70 used as a mask, boron (B) is injected in a dose for example of approximately $1 \times 10^{13}$ to $5 \times 10^{13}$ cm$^{-2}$. Subsequently resist pattern 70 is removed.

Figure 50:
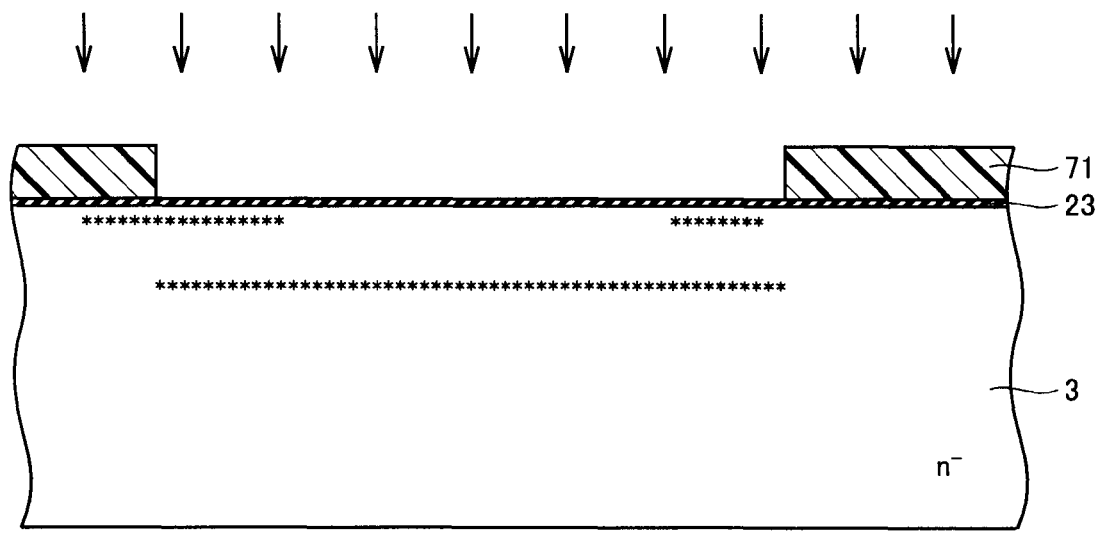
FIGS. 50-57 are cross sections for illustrating steps performed after those shown in FIGS. 49-56, respectively, in the same embodiment.

Then, as shown in FIG. 50, on a surface of silicon nitride film 23 a resist pattern 71 is provided. With resist pattern 71 used as a mask, boron (B) is injected in a dose for example of approximately $1 \times 10^{12}$ to $3 \times 10^{12}$ cm$^{-2}$ by high energy injection from a surface of $n^-$ type semiconductor region 3 into a region to a depth of approximately 2 μm to 5 μm. Subsequently resist pattern 71 is removed.

Figure 51:
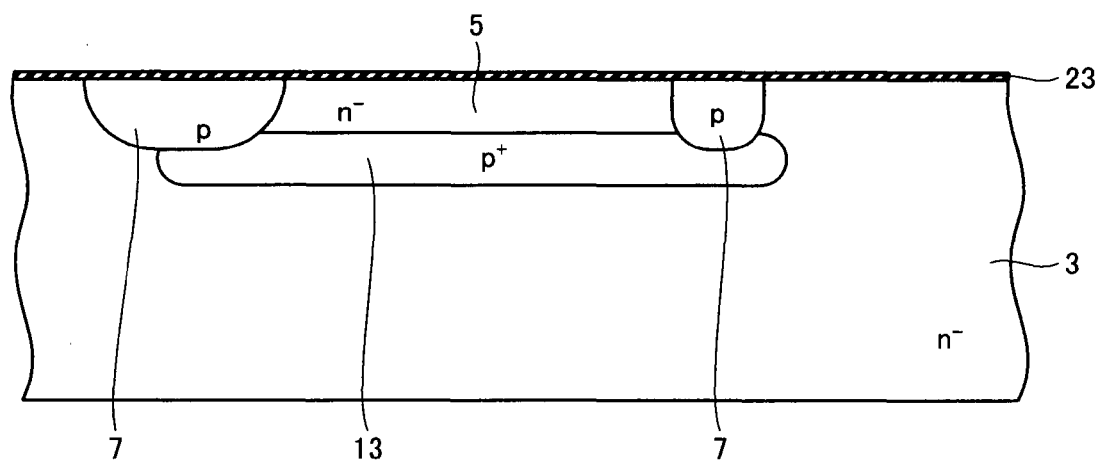

Then, as shown in FIG. 51, the intermediate product is annealed at a predetermined temperature to diffuse the injected boron to provide p diffusion region 7 and $p^-$ buried layer 13. P diffusion region 7 surrounds a predetermined region of $n^-$ type semiconductor region 3 peripherally, and this region will serve as the drain region, i.e., $n^-$ diffusion region 5.

Figure 52:
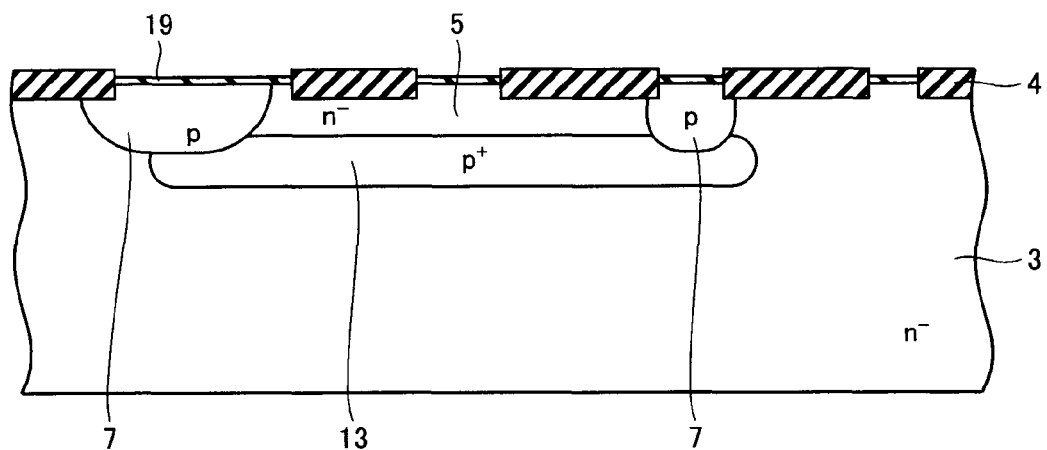

Then silicon nitride film 23 has a predetermined region removed to expose a surface of $n^-$ type semiconductor region 3. Then the intermediate product is oxidized, as predetermined, to provide LOCOS film 4 at the exposed surface of $n^-$ type semiconductor region 3 (see FIG. 52). Thereafter silicon nitride film 23 that remains is removed to expose a surface of $n^-$ type semiconductor region 3. Then the intermediate product is thermally oxidized, as predetermined, to provide gate oxide film 19 at the exposed surface of $n^-$ type semiconductor region 3, as shown in FIG. 52.

Figure 53:
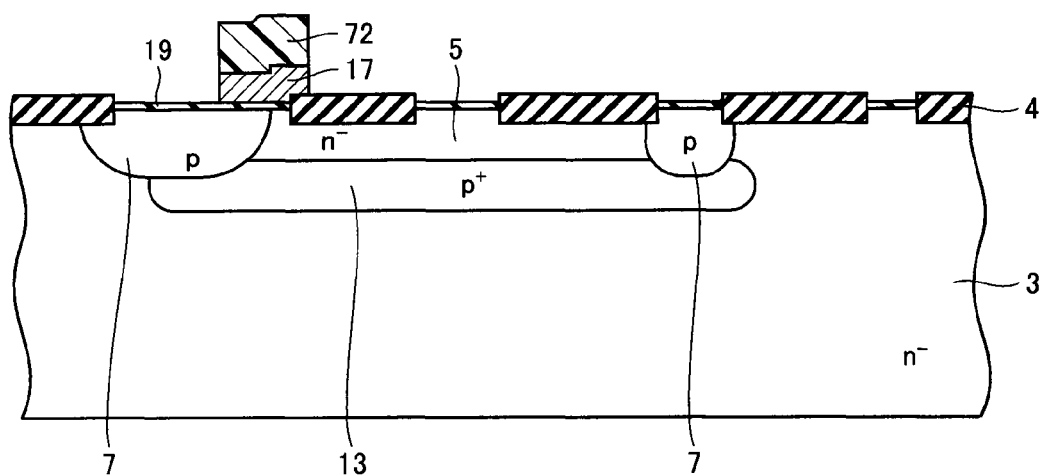
Figure 54:
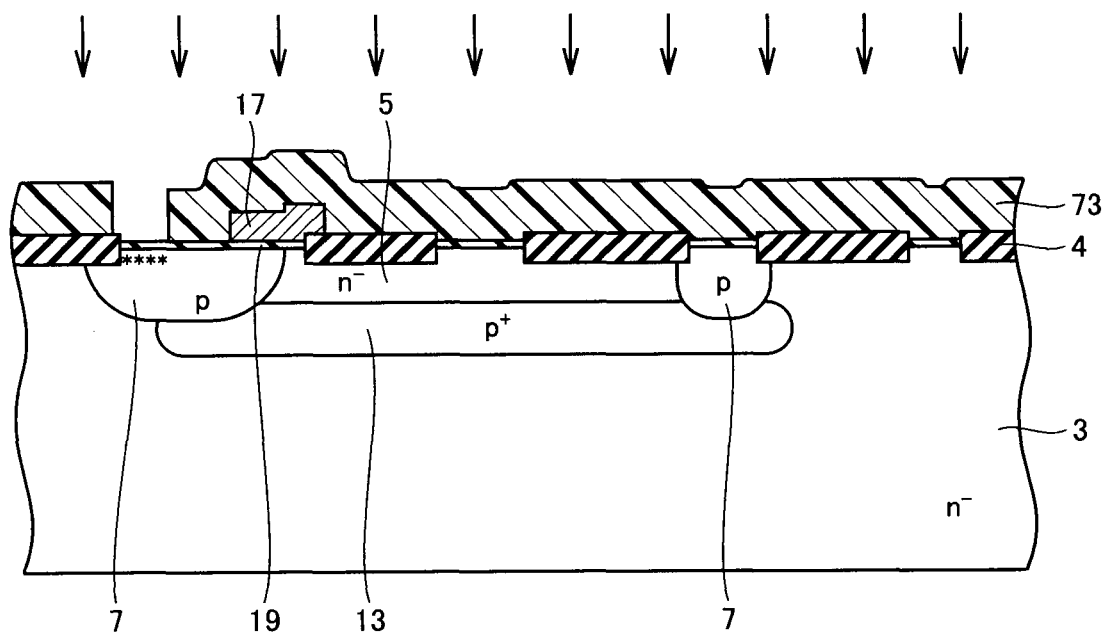

Then on a surface of $n^-$ type semiconductor region 3 a polysilicon film (not shown) is provided. On a surface of the polysilicon film a resist pattern 72 is provided (see FIG. 53). With resist pattern 72 used as a mask, the polysilicon film is anisotropically etched to provide gate electrode 17, as shown in FIG. 53. Thereafter resist pattern 72 is removed. Then as shown in FIG. 54 a resist pattern 73 is provided. With resist pattern 73 used as a mask, boron (B) is injected in a dose for example of approximately $3 \times 10^{15}$ to $6 \times 10^{15}$ cm$^{-2}$ into p diffusion region 7. Subsequently resist pattern 73 is removed.

Figure 55:
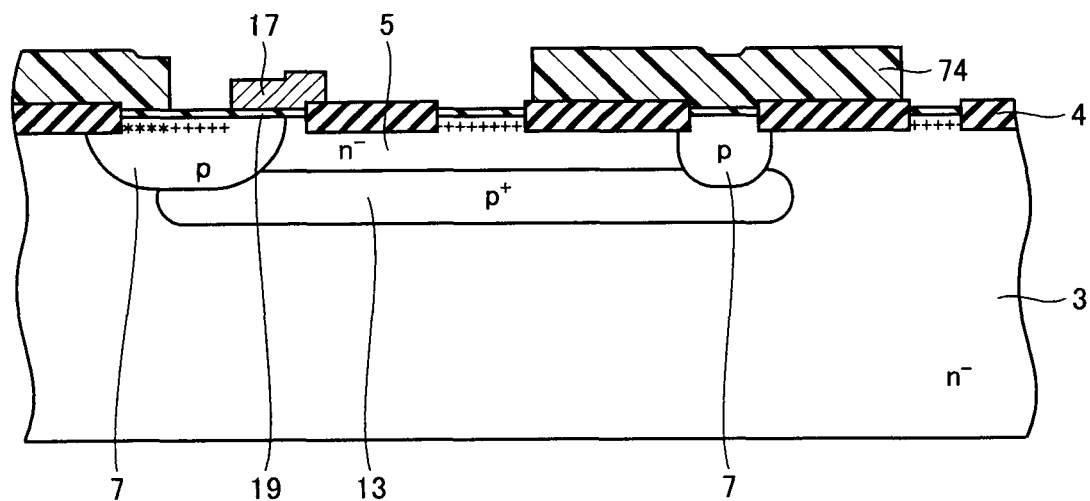
Figure 56:
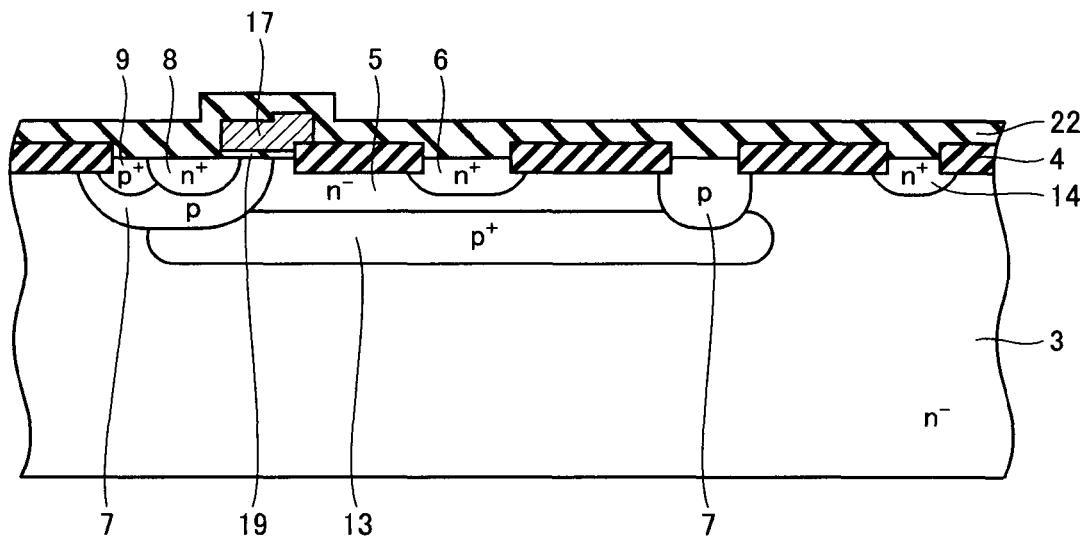

Then, as shown in FIG. 55, a resist pattern 74 is provided. With resist pattern 74 used as a mask, phosphorus (P) is injected in a dose for example of approximately $3 \times 10^{15}$ to $6 \times 10^{15}$ cm$^{-2}$ into $n^-$ type semiconductor region 3. Subsequently resist pattern 74 is removed. Then, as shown in FIG. 56, gate electrode 17 is covered with insulation film 22. Thereafter the intermediate product is annealed, as predetermined, to diffuse the injected boron and phosphorus to provide $p^+$ diffusion region 9 and $n^+$ diffusion regions 8, 6 and 14.

Figure 57:
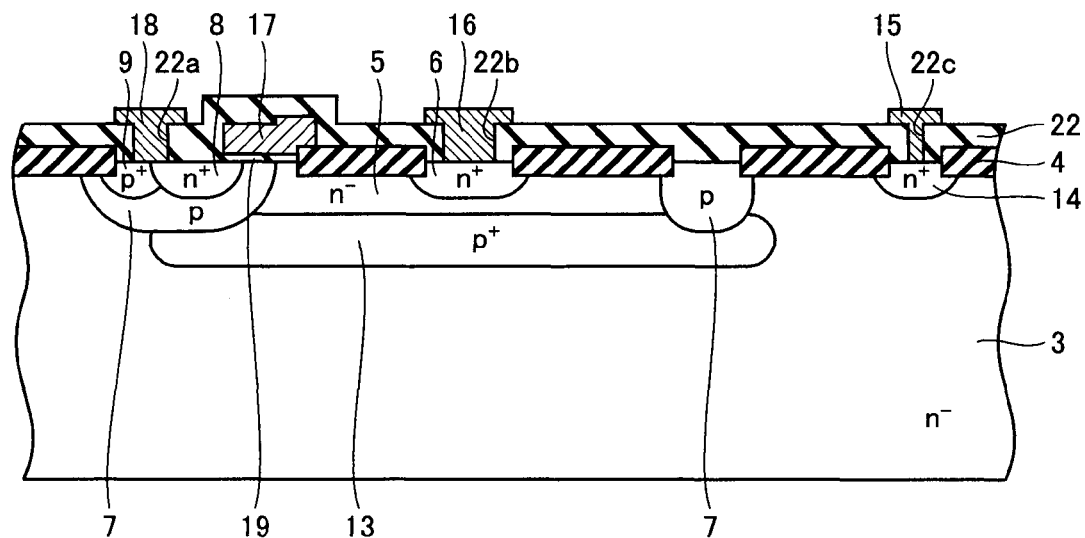

Then, as shown in FIG. 57, insulation film 22 is subjected to photolithography and processed, as predetermined, to form openings 22a, 22b, 22c for providing an electrode. Then sputtering is performed to deposit an aluminum-silicon (Al—Si) film (not shown) on insulation film 22 to introduce it into openings 22a, 22b, 22c. The aluminum-silicon film is subjected to photolithography and processed, as predetermined, to provide drain electrode 16, source electrode 18 and electrode 15. The semiconductor device shown in FIGS. 42 and 43 is thus completed.

First Exemplary Variation

As has been described in the first embodiment, as a circuit canceling a parasitic capacitance present between a field effect transistor's source and drain, there exists a circuit having two field effect transistors Ti and T2 connected in parallel (see FIG. 22).

Figure 58:
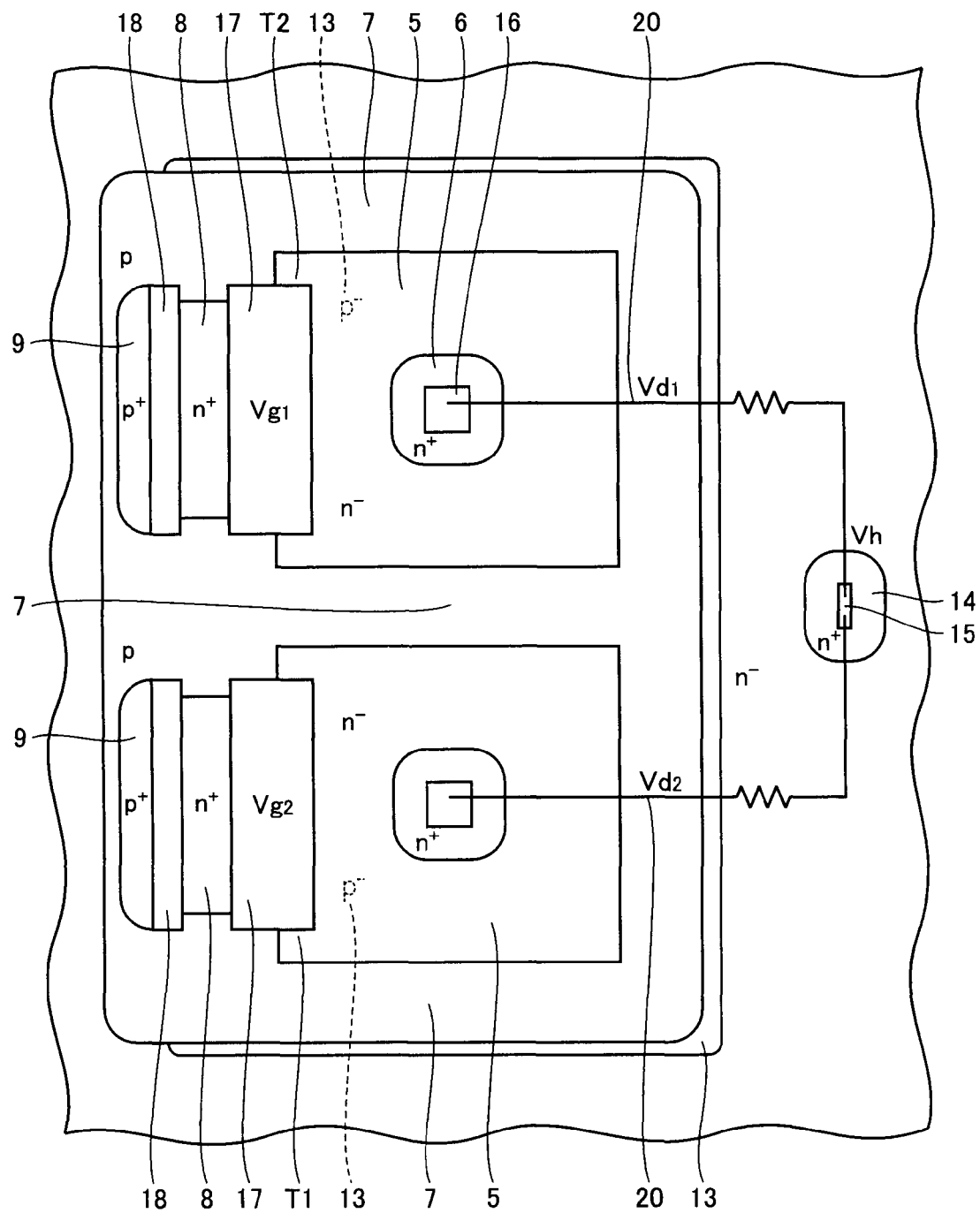
FIGS. 58 and 59 are plan views of semiconductor devices of first and second exemplary variations, respectively, of the same embodiment.

A semiconductor device corresponding to such circuit has a structure in a plan view, as shown in FIG. 58. As shown in FIG. 58, two field effect transistors T1 and T2 are arranged side by side. Field effect transistors T1 and T2 have their respective source regions ($n^+$ diffusion region 8) provided in the region of p diffusion region 7 and spaced from each other, and their respective drain regions ($n^-$ diffusion region 5) peripherally surrounded by p diffusion region 7 and thus electrically isolated from each other. The other components are similar to those of the structure shown in FIGS. 42 and 43. Accordingly they are identically denoted and will not be described repeatedly.

This semiconductor device 1 can also obtain sufficiently high breakdown voltage as it has $p^-$ buried layer 13 having an impurity concentration set to be relatively low to allow $p^-$ buried layer 13 to be completely depleted in the off state, as has been described above.

Second Exemplary Variation

Figure 59:
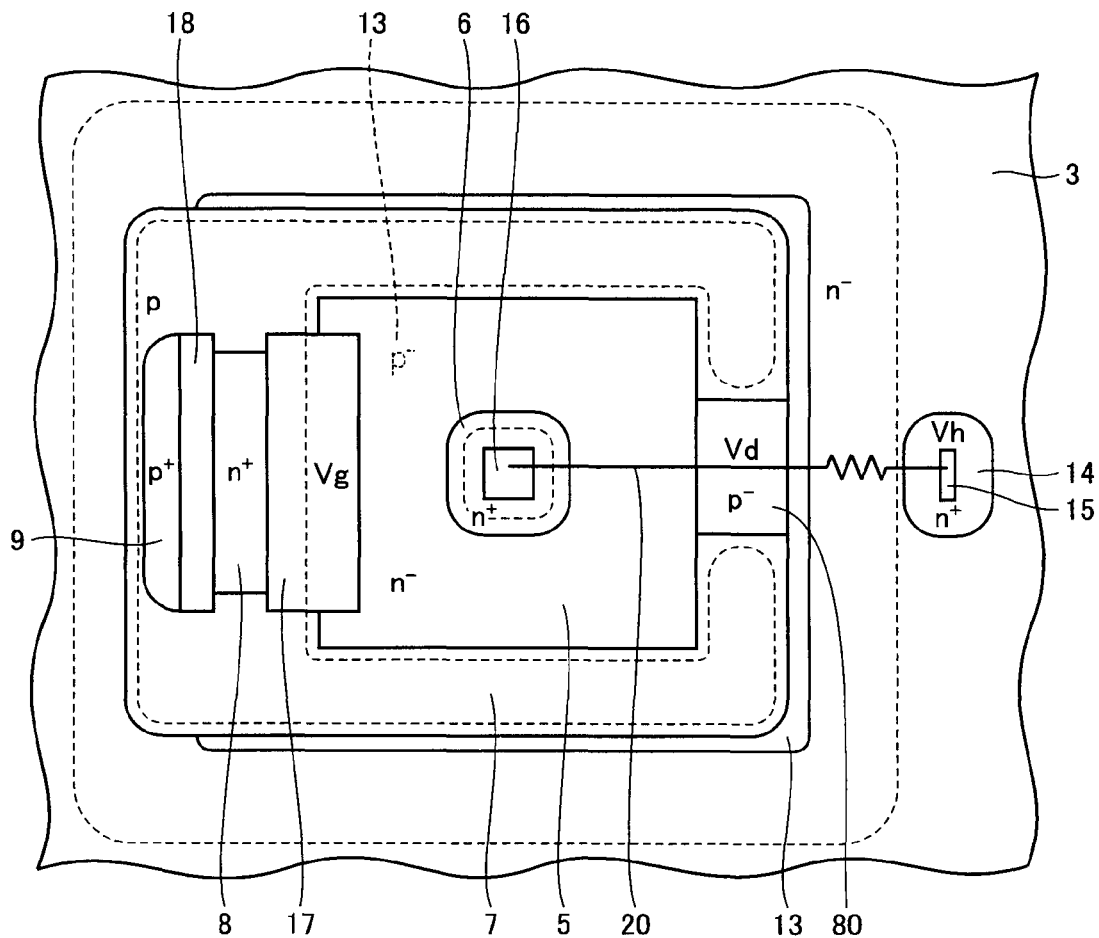

In the above described semiconductor device p diffusion region 7 surrounds $n^-$ diffusion region 5 in contact with $n^-$ diffusion region 5. Of p diffusion region 7, a portion immediately underlying interconnect 20 may be replaced with a $p^-$ diffusion region 80 having an impurity concentration allowing complete depletion in the off state, as $p^-$ buried layer 13 does, as shown in FIG. 59. Such replacement with $p^-$ diffusion region 80 can provide a separation breakdown voltage of a magnitude corresponding to a potential barrier, and reduce or prevent otherwise reduced breakdown voltage attributed to an electric field of interconnect 20.

Figure 60:
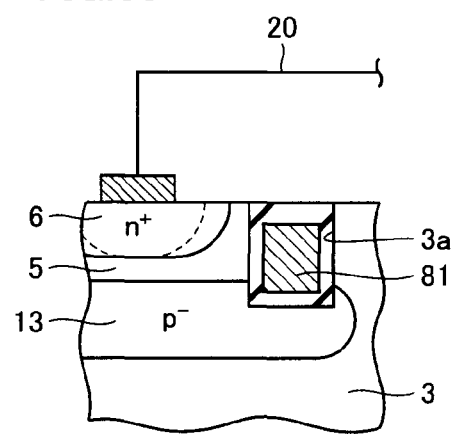
FIGS. 60 and 61 are partial cross sections of the semiconductor device of the second exemplary variation of the same embodiment in another and still another structures, respectively.
Figure 61:
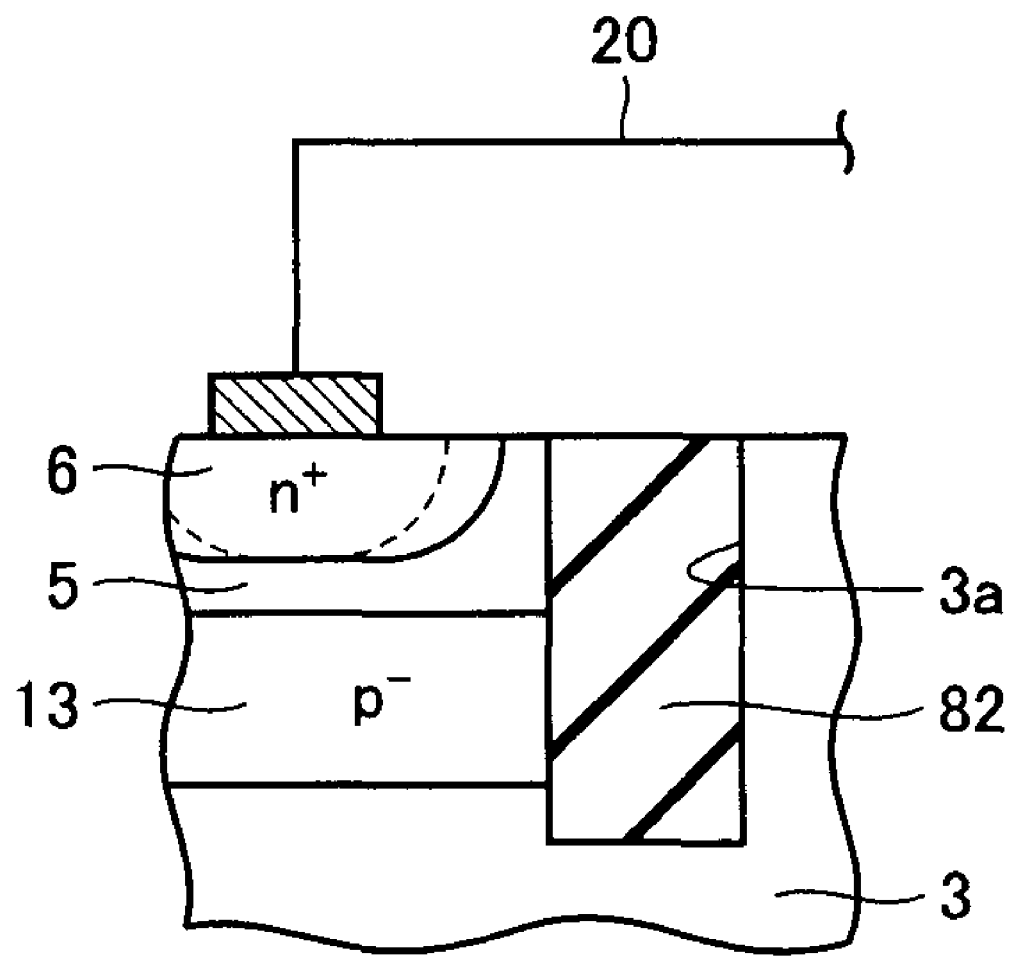

Other than p⁻ diffusion region 80 provided in p diffusion region 7 at a portion immediately underlying interconnect 20, a trench 3a reaching p⁻ buried layer 13 may be provided in that region and a polysilicon film 81 may be introduced in trench 3a and covered with an oxide film or the like, as shown in FIG. 60. Alternatively, as shown in FIG. 61, trench 3a may have an insulator 82 introduced therein. Such structures can also eliminate a pn junction at a portion immediately underlying interconnect 20 and thus further reduce or prevent reduced breakdown voltage attributed to an electric field.

Note that the semiconductor device described in the second embodiment may also have n⁻ type semiconductor region 3 provided at a surface of p type semiconductor substrate 2 and in a vicinity of the surface, as described in the second exemplary variation of the first embodiment. A logic signal provided with reference to the source's potential (Vs) different from that (Vsub) of p type semiconductor substrate 2 will be converted to a logic signal provided with reference to high potential Vh (see FIG. 26).

The present semiconductor device is effectively applicable to a drive control circuit and the like for operating an induction motor and the like.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a first semiconductor region of a first conduction type, having a main surface;
   a second semiconductor region of said first conduction type, serving as a drain region of a field effect transistor, said second semiconductor region extending from one side to an other side and also extending from said main surface of said first semiconductor region to a predetermined depth;
   a third semiconductor region of a second conduction type, provided at said one side of said second semiconductor region and extending from a surface of said first semiconductor region to a predetermined depth to space said one side of said second semiconductor region and said first semiconductor region from each other;
   a trench provided at said other side of said second semiconductor region at a surface of said first semiconductor region and having a predetermined depth to space said other side of said second semiconductor region and said first semiconductor region from each other;
   a fourth semiconductor region of said first conduction type, serving as a source region of said field effect transistor, said fourth semiconductor region being provided in a region extending from a surface of said third semiconductor region to a depth shallower than a bottom of said third semiconductor region such that said fourth semiconductor region is spaced from said first semiconductor region by said third semiconductor region;
   a fifth semiconductor region of said second conduction type, provided in contact with a bottom of said third semiconductor region and a bottom of said trench and extending from said bottom of said third semiconductor region to said bottom of said trench to space a bottom of said second semiconductor region and said first semiconductor region from each other;
   a sixth semiconductor region of said first conduction type to which a predetermined high potential is connected, said sixth semiconductor region being spaced from said trench, said sixth semiconductor region being located in a region opposite to said third semiconductor region with said trench posed therebetween, said sixth semiconductor region extending from a surface of said first semiconductor region to a predetermined depth;
   an electrode portion serving as a gate electrode of said field effect transistor, said electrode portion being provided on a surface of a portion of said third semiconductor region with a gate insulation film posed therebetween, said portion of said third semiconductor region being sandwiched between said second semiconductor region and said fourth semiconductor region; and
   an interconnect having a predetermined resistance and electrically connecting said second semiconductor region and said sixth semiconductor region together.

2. The semiconductor device according to claim 1, wherein said trench extends from a portion located at said other side of said second semiconductor region toward said third semiconductor region and surrounds said second semiconductor region peripherally as seen in a plane.

3. The semiconductor device according to claim 1, wherein:
   said field effect transistor includes a first field effect transistor and a second field effect transistor; and
   said first field effect transistor and said second field effect transistor are connected in parallel.

4. The semiconductor device according to claim 3, wherein:
   said fourth semiconductor region has a first portion provided in said third semiconductor region and serving as a source region of said first field effect transistor, and a second portion provided in said third semiconductor region and spaced from said first portion, and serving as a source region of said second field effect transistor;
   said second semiconductor region has a first portion serving as a drain region of said first field effect transistor, and a second portion serving as a drain region of said second field effect transistor; and
   said trench extends from a portion located at said other side of said second semiconductor region toward said third semiconductor region and surrounds said first portion of said second semiconductor region peripherally as seen in a plane and said second portion of said second semiconductor region peripherally as seen in said plane to space said first portion of said second semiconductor region and said second portion of said second semiconductor region from each other.

5. The semiconductor device according to claim 1, comprising:
   a semiconductor substrate of said second conduction type, having a main surface, wherein said first semiconductor region extends from said main surface of said semiconductor substrate to a predetermined depth.

6. A semiconductor device comprising:
   a first semiconductor region of a first conduction type, having a main surface;
   a second semiconductor region of said first conduction type, serving as a drain region of a field effect transistor, said second semiconductor region extending from one side to an other side and also extending from said main surface of said first semiconductor region to a first depth;
   a third semiconductor region of a second conduction type, provided at a surface of said first semiconductor region and extending to a predetermined depth, and sandwiching said second semiconductor region at said one side of said second semiconductor region and said other side of said second semiconductor region to space said one side of said second semiconductor region and said first semiconductor region from each other and also space said other side of said second semiconductor region and said first semiconductor region from each other;

a fourth semiconductor region of said first conduction type, serving as a source region of said field effect transistor, said fourth semiconductor region being provided in a region extending from a surface of said third semiconductor region to a depth shallower than a bottom of said third semiconductor region such that said fourth semiconductor region is spaced from said first semiconductor region by said third semiconductor region;

a fifth semiconductor region of said second conduction type, provided in contact with a bottom of said third semiconductor region located at said one side of said second semiconductor region and a bottom of said third semiconductor region located at said other side of said second semiconductor region, said fifth semiconductor region extending from said bottom of said third semiconductor region located at said one side to said bottom of said third semiconductor region located at said other side, said fifth semiconductor region having a predetermined impurity concentration allowing said fifth semiconductor region, with said field effect transistor in an off state, to be completely depleted by a depletion layer extending from an interface with said second semiconductor region and a depletion layer extending from an interface with said first semiconductor region;

a sixth semiconductor region of said first conduction type to which a predetermined high potential is connected, said sixth semiconductor region being spaced from said third semiconductor region located at said other side, said sixth semiconductor region being located in a region opposite to said third semiconductor region located at said one side, with said third semiconductor region located at said other side posed therebetween, said sixth semiconductor region extending from a surface of said first semiconductor region to a predetermined depth;

an electrode portion serving as a gate electrode of said field effect transistor, said electrode portion being provided on a surface of a portion of said third semiconductor region with a gate insulation film posed therebetween, said portion of said third semiconductor region being sandwiched between said second semiconductor region and said fourth semiconductor region; and an interconnect having a predetermined resistance and electrically connecting said second semiconductor region and said sixth semiconductor region together.

7. The semiconductor device according to claim 6, wherein said third semiconductor region extends from a portion located at said other side of said second semiconductor region toward a portion located at said one side of said second semiconductor region and surrounds said second semiconductor region peripherally as seen in a plane.

8. The semiconductor device according to claim 6, wherein said third semiconductor region includes a region having a portion immediately underlying said interconnect and having an impurity concentration lower than that of a portion that does not immediately underlie said interconnect.

9. The semiconductor device according to claim 6, wherein:
said third semiconductor region surrounds said second semiconductor region, as seen in a plane, except for a region of a portion immediately underlying said interconnect;
said region of said portion immediately underlying said interconnect has an opening reaching said fifth semiconductor region; and
said opening has at least one of insulator and polysilicon introduced therein.

10. The semiconductor device according to claim 6, wherein:
said field effect transistor includes a first field effect transistor and a second field effect transistor; and
said first field effect transistor and said second field effect transistor are connected in parallel.

11. The semiconductor device according to claim 10, wherein:
said fourth semiconductor region has a first portion provided in said third semiconductor region and serving as a source region of said first field effect transistor, and a second portion provided in said third semiconductor region and spaced from said first portion, and serving as a source region of said second field effect transistor;
said second semiconductor region has a first portion serving as a drain region of said first field effect transistor, and a second portion serving as a drain region of said second field effect transistor; and
said third semiconductor region extends from a portion located at said other side of said second semiconductor region toward a portion located at said one side of said second semiconductor region and surrounds said first portion of said second semiconductor region peripherally as seen in a plane and said second portion of said second semiconductor region peripherally as seen in said plane to space said first portion of said second semiconductor region and said second portion of said second semiconductor region from each other.

12. The semiconductor device according to claim 6, comprising:
a semiconductor substrate of said second conduction type, having a main surface, wherein said first semiconductor region extends from said main surface of said semiconductor substrate to a predetermined depth.

* * * * *